(12) United States Patent
Ogura et al.

(10) Patent No.: US 10,461,380 B2
(45) Date of Patent: Oct. 29, 2019

(54) BATTERY ATTACHMENT APPARATUSES

(71) Applicant: MAKITA CORPORATION, Anjo-shi, Aichi (JP)

(72) Inventors: Hironori Ogura, Anjo (JP); Hideyuki Taga, Anjo (JP)

(73) Assignee: MAKITA CORPORATION, Anjo (JP)

( * ) Notice: Subject to any disclaimer, the term of this patent is extended or adjusted under 35 U.S.C. 154(b) by 327 days.

(21) Appl. No.: 15/356,782

(22) Filed: Nov. 21, 2016

(65) Prior Publication Data

US 2017/0153291 A1 Jun. 1, 2017

(30) Foreign Application Priority Data

Dec. 1, 2015 (JP) .................. 2015-234447
Mar. 31, 2016 (JP) .................. 2016-071244

(51) Int. Cl.

| | |
|---|---|
| *G01R 31/36* | (2019.01) |
| *H01M 10/42* | (2006.01) |
| *H02J 7/00* | (2006.01) |
| *H01R 13/453* | (2006.01) |
| *H01M 10/48* | (2006.01) |
| *G01R 31/367* | (2019.01) |
| *G01R 31/371* | (2019.01) |
| *H01R 13/629* | (2006.01) |

(52) U.S. Cl.
CPC .......... *H01M 10/48* (2013.01); *G01R 31/367* (2019.01); *G01R 31/371* (2019.01); *H01M 10/4285* (2013.01); *H01R 13/453* (2013.01); *H01R 13/629* (2013.01); *H02J 7/0021* (2013.01); *H02J 7/0042* (2013.01); *H01M 2220/30* (2013.01)

(58) Field of Classification Search
None
See application file for complete search history.

(56) References Cited

U.S. PATENT DOCUMENTS

2001/0000945 A1* 5/2001 Watson .................... B25F 5/02
320/114
2004/0135542 A1 7/2004 Ito
(Continued)

FOREIGN PATENT DOCUMENTS

| EP | 1414127 A2 | 4/2004 |
| EP | 2107386 A2 | 10/2009 |

(Continued)

OTHER PUBLICATIONS

English Translation of WO2014188786 (Year: 2014).*
Apr. 13, 2017 Search Report issued in European Patent Application No. EP 16200809.8.

*Primary Examiner* — Jermele M Hollington
(74) *Attorney, Agent, or Firm* — Oliff PLC

(57) ABSTRACT

An electric tool battery is detachably attached to a battery attachment apparatus. The battery attachment apparatus has a case as an exterior portion thereof, including a lock hole establishing communication between the exterior and interior of the case to allow an external lock member to be locked. Further, the battery attachment apparatus has a cover member closing the opening of the lock hole from within the case, and a mounting portion to which the cover member is mounted and which is set on an inner surface of the case.

15 Claims, 23 Drawing Sheets

(56) References Cited

U.S. PATENT DOCUMENTS

| | | | |
|---|---|---|---|
| 2005/0083639 A1* | 4/2005 | Zick | H01M 2/1016 361/600 |
| 2005/0231647 A1 | 10/2005 | Chou | |
| 2010/0197171 A1* | 8/2010 | Matsumoto | B60L 11/1818 439/660 |
| 2012/0045667 A1* | 2/2012 | Yoneda | H01M 2/1055 429/7 |
| 2015/0357612 A1* | 12/2015 | Uchida | B25F 5/00 429/99 |

FOREIGN PATENT DOCUMENTS

| | | | |
|---|---|---|---|
| JP | H04-4446 U | 1/1992 | |
| JP | H09-257013 A | 9/1997 | |
| JP | 2000-270420 A | 9/2000 | |
| JP | 2004-147360 A | 5/2004 | |
| JP | 2013-042103 A | 2/2013 | |
| WO | WO-2014188786 A1 * | 11/2014 | B25F 5/00 |

\* cited by examiner

BATTERY ATTACHMENT APPARATUSES

CROSS-REFERENCE TO RELATED APPLICATIONS

This application claims priorities to Japanese patent application serial number 2015-234447 filed Dec. 1, 2015, and Japanese patent application serial number 2016-71244 filed Mar. 31, 2016, the contents of which are incorporated herein by reference in their entirety for all purposes.

BACKGROUND

Embodiments of the present invention relate to a battery attachment apparatus to which an electric tool battery is detachably attached.

Nowadays, electric tool batteries are increasingly used as the drive power source of electric tools. When there is little residual capacitance remaining, the electric tool battery is detached from the tool main body, and is attached to a dedicated charger for recharging (See, for example, Japanese Laid-Open Patent Publication No. 2004-147360). A dedicated diagnosis device which is also referred to as a battery checker and which is used to check the electric tool battery for abnormality is known. The diagnosis device diagnoses the number of times that the attached electric tool battery has been recharged, the battery voltage, and the battery inner resistance thereof. Additionally, the diagnosis device diagnoses the battery capacitance, and the electric tool battery as a whole. The diagnosis device formulates the battery condition in the form of diagnosis results and outputs and displays them to the user. The electric tool battery is detachably attached to the charger and the diagnosis device.

Hereinafter, the apparatus other than the tool, to which the electric tool battery is detachably attached, will be generally referred to as a battery attachment apparatus. From the viewpoint of convenience in use, the battery attachment apparatus may desirably be hung on the wall. To obtain a wall-hanging type battery attachment apparatus, the case is provided with a lock hole into which a wall-hanging screw that is mounted to the wall is inserted (See, for example, Japanese Utility Model Publication No. H04-004446). The lock hole is formed so as to establish communication between the exterior and the interior of the case. When the case is molded by using plastic (synthetic resin) as the material, the lock hole is formed along with the other exterior configuration of the case.

Foreign matter may enter the interior of the case from the exterior of the case through the lock hole, because the lock hole is formed so as to establish communication between the exterior and the interior of the case. Consequently, static electricity may also enter the interior of the case from the exterior of the case through the lock hole to adversely affect the interior electronic components. Such a problem is becoming more and more conspicuous because recently, as the battery attachment apparatus has been reduced in size.

Thus, there is a need for a battery attachment apparatus which is configured to prevent a malfunction of the product by preventing intrusion of both foreign matter and static electricity from the exterior into the interior of the case through the wall-hanging lock hole.

SUMMARY

According to an aspect of the invention, there is provided a battery attachment apparatus to which an electric tool battery is detachably attached. The battery attachment apparatus has a case as an exterior portion thereof, and a lock hole establishing communication between the exterior and interior of the case to allow an external lock member to be locked. Further, the battery attachment apparatus has a cover member closing the opening of the lock hole from within the case, where the cover member is mounted to a mounting portion and set on an inner surface of the case.

Thus, the battery attachment apparatus may be hung on the wall by inserting into the lock hole, for example, a wall-hanging screw mounted to the wall serving as said external lock member. In this way the apparatus may function as a wall-hanging type battery attachment apparatus. The cover member mounted to the mounting portion can close the opening of the lock hole from within the case. As a result, the cover member prevents intrusion of foreign matter and static electricity into the interior of case from the exterior thereof through the lock hole. This may prevent a malfunction of the product due to the intrusion of such foreign matter or static electricity.

According to another aspect of the invention, the mounting portion may include a mounting support portion that faces the lock hole. The mounting support portion may be configured to support the cover member from within toward the lock hole. For example, the mounting support portion is provided at a position where it faces the lock hole, while supporting the cover member from within, toward the lock hole. As a result, even if foreign matter presses the cover member through the lock hole, the cover member is supported by the mounting support portion and is not easily detached. Thus, the cover member has additional structural support against intrusion of foreign matter from the outside. This helps substantially to prevent a malfunction of the product.

According to another aspect of the invention, the mounting portion may be configured such that the cover member is mounted to the mounting portion by moving the cover member along the inner surface of the case. Thus, the cover member may be mounted to the mounting portion without interference from the mounting support portion. As a result, the cover member may be mounted to the mounting portion easily and reliably.

According to another aspect of the invention, the cover member is provided with a structure into which the mounting support portion is fitted. Thus, such cover member structure may enhance the support of the cover member by fitting of the mounting support portion. As a result, it is possible to secure the mounting of the cover member to the mounting portion and to make it more reliable.

According to another aspect of the invention, the mounting portion may include a detachment regulating portion that is configured to regulate the cover member from detaching with respect to the mounting portion. The mounting support portion may be configured to allow mounting of the cover member to the mounting portion beyond the detachment regulating portion through elastic deformation of the mounting support portion. In this manner, the cover member may be regulated and prevented from detaching with respect to the mounting portion. As a result, the cover member may be firmly maintained in the mounted state with respect to the mounting portion. Further, due to the elastic deformation of the mounting support portion, the detachment regulating portion enables the cover member to be mounted without interference from the mounting support portion. Thus, the cover member may be mounted in a simplified manner without interference.

According to another aspect of the invention, the mounting portion may be configured such that the cover member is mounted thereto by moving the cover member downwards from above relative to the mounting portion. Thus, the mounting direction of the cover member with respect to the mounting portion coincides with the gravitational direction. This helps to suppress detachment of the cover member.

According to another aspect of the invention, the cover member may be provided with a wall portion that overlaps with an edge of the mounting portion. The edge of the opening of the lock hole is closed by the wall portion of the cover member. As a result, the closing area along the surface of the lock hole is increased to thereby achieve an enhancement in air-tightness. Thus, intrusion of foreign matter and static electricity from the lock hole to the interior of the case may be further suppressed.

According to another aspect of the invention, the lock member may have a leg portion supported while embedded in a wall, and a lock head portion of a larger outer diameter than the leg portion. The lock hole may include a first hole portion allowing insertion of the lock head portion, and a second hole portion of a shorter inner diameter than the first hole portion so as to regulate detachment of the inserted lock head portion. The first and second hole portions are formed continuously, one above and the other below. Thus, the battery attachment apparatus may be hung on the wall by inserting into the lock hole as the external lock member, for example, a wall-hanging male screw or a wall-hanging nail that is mounted to the wall. As a result, a wall-hanging type battery attachment apparatus may be provided by utilizing a generally used male screw as the lock member.

DETAILED DESCRIPTION

Figure 1:
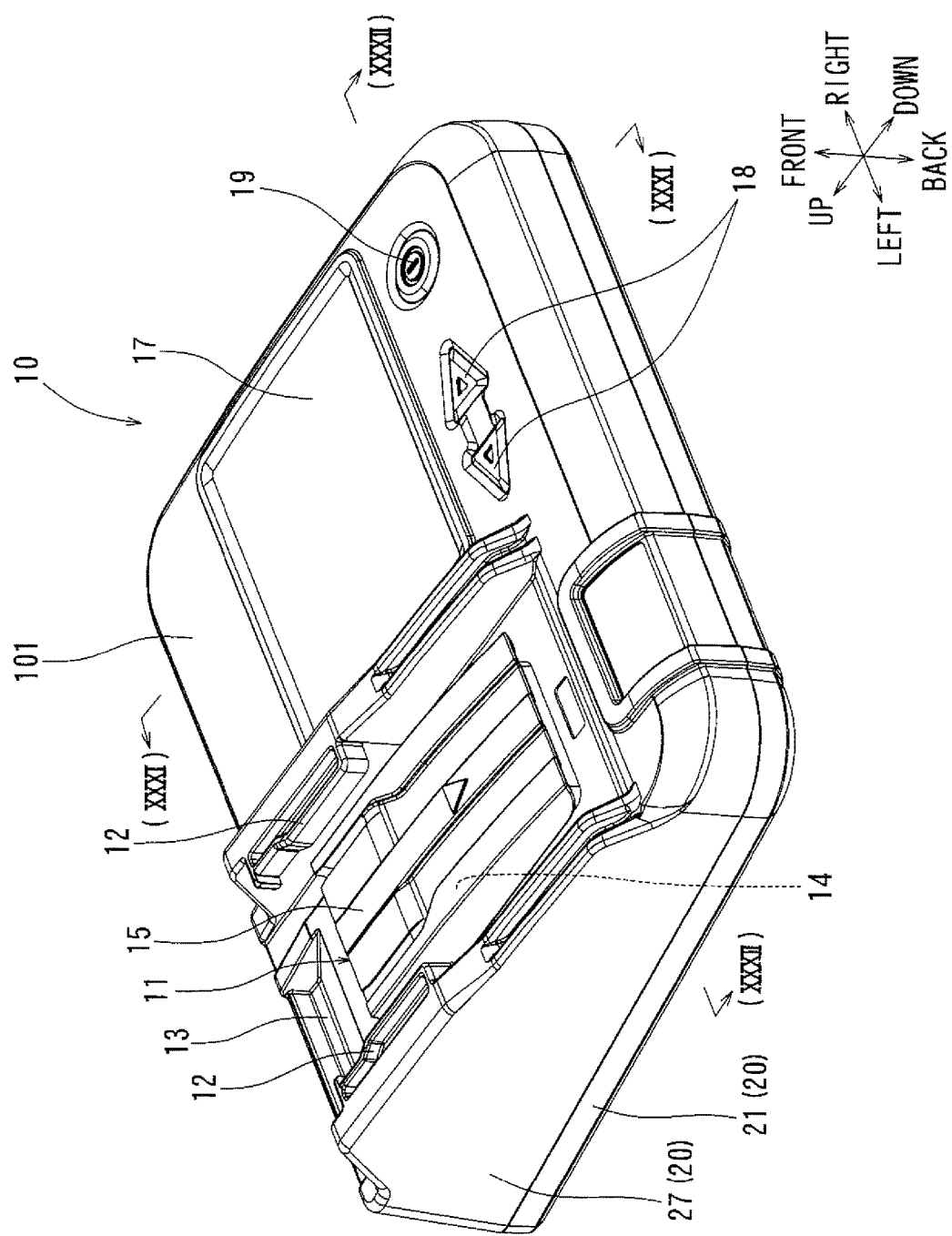
FIG. 1 is a perspective view of a battery checker from front thereof.
Figure 2:
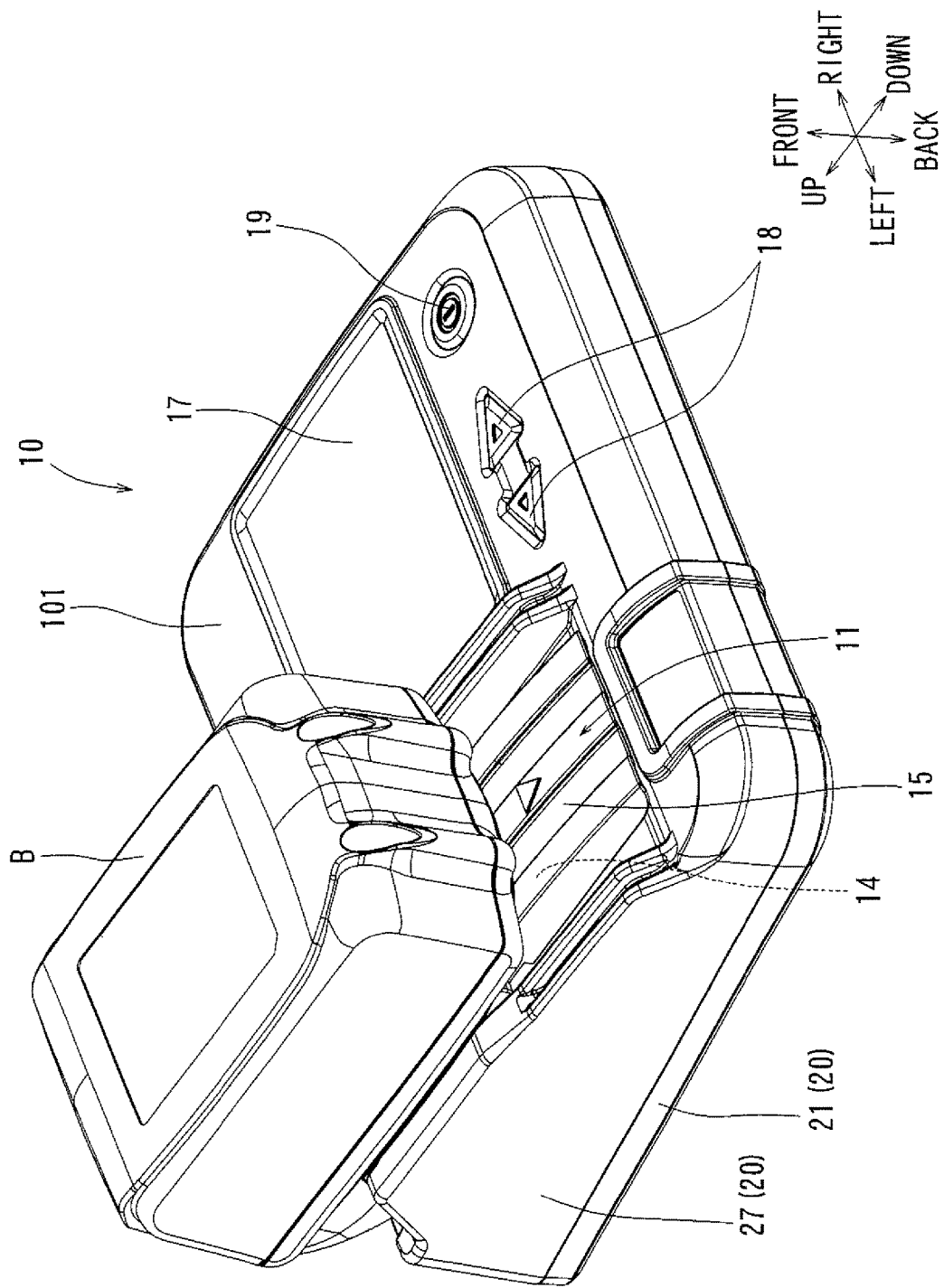
FIG. 2 is a perspective view for illustrating a state in which an electric tool battery is attached to the battery checker.
Figure 3:
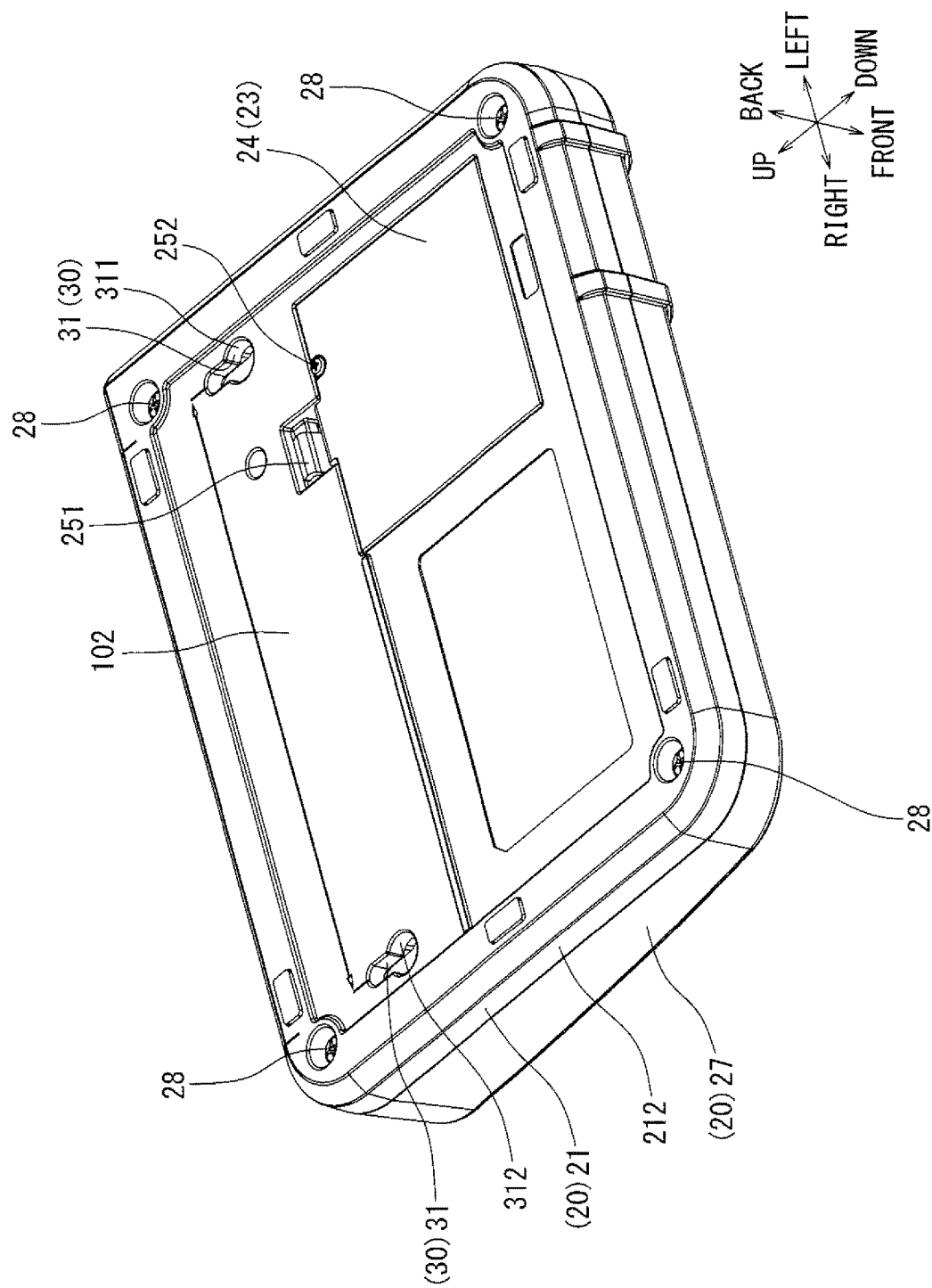
FIG. 3 is a perspective view of the battery checker from back thereof.
Figure 4:
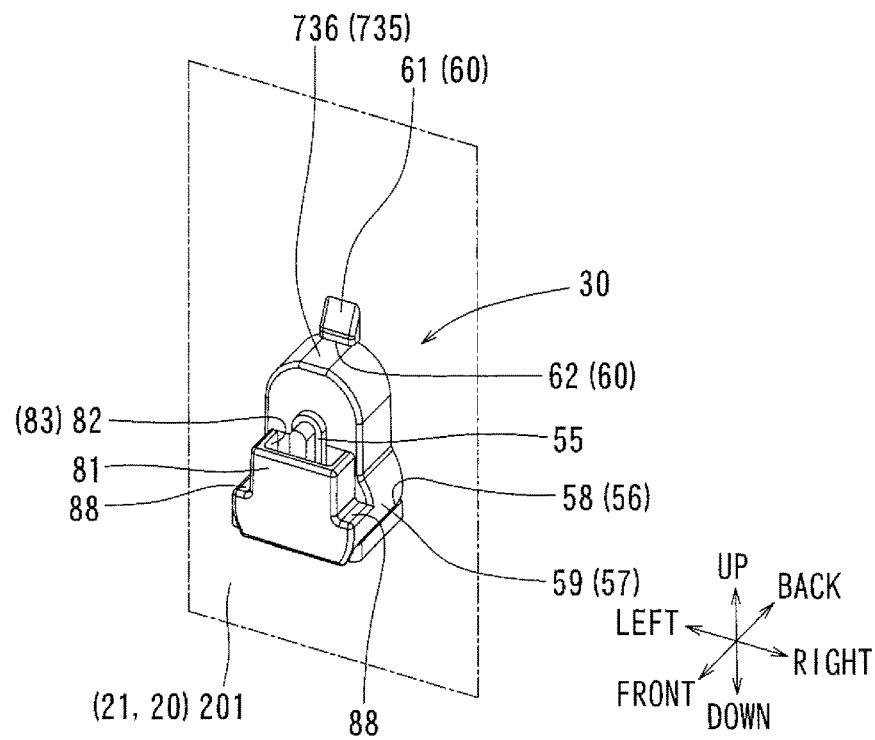
FIG. 4 is a perspective view of a lock structure from an inside of a case.
Figure 5:
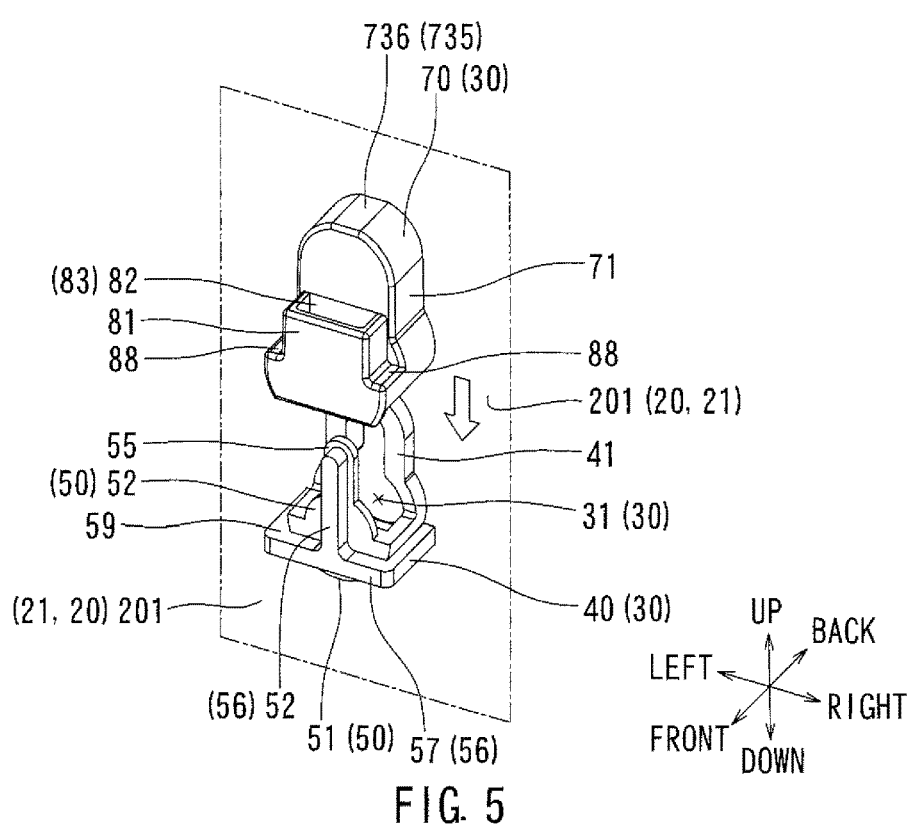
FIG. 5 is a perspective view of the lock structure when a cover member is mounted to a mounting portion.

In the following, an embodiment of a battery attachment apparatus according to the present invention will be described with reference to FIGS. 1 to 27. As shown in FIGS. 1 to 3, a battery checker 10 is an electric apparatus to which an electric tool battery B is detachably attached. Normally, the battery checker 10 is driven by electrical power supplied from the electric tool battery B attached to the battery attachment portion 11. When there is no electrical power supply from the electric tool battery B, the battery checker 10 can be driven by a dry battery accommodated in a dry battery accommodating portion 23 (See FIG. 3). The battery checker 10 is of a wall-hanging type where it can be hung, for example, on a male screw fixed to an indoor wall. Thus, in the following description of the battery checker 10, the "front, rear, upper, lower, left, and right" sides correspond to the respective sides as determined with respect to the battery checker 10 position when it is hung on a vertical wall.

In particular, the "upper and lower" sides in the drawings correspond to the upper and lower sides of the battery checker 10 as it is positioned when hung on the wall, wherein the wall is coplanar with the up-down and left-right axes. The "front" side in the drawings corresponds to the front side of the battery checker 10 position when it is hung on the wall, wherein the front side faces the user. The "back" side in the drawings corresponds to the back side of the battery checker 10 position when it is hung on the wall, wherein the back side faces the wall surface. The "right-left"

direction in the drawings is the right-left direction as seen from the "front" side by the user.

The battery checker 10 hung on the wall is formed as a dedicated diagnosis device that can check whether the state of the electric tool battery B is normal or abnormal. The diagnosis device diagnoses the number of times that the attached electric tool battery B has been recharged, the battery voltage, and the battery inner resistance. The diagnosis device may also diagnose the battery capacitance, or further, may also synthetically diagnose the state of the electric tool battery B. The diagnosis device formulates the battery condition in the form of diagnosis results and outputs and displays these to the user. The battery checker 10 is provided with a battery attachment portion 11 for attaching the electric tool battery B, and a display output portion 17 for outputting and displaying the diagnosis results.

A front surface 101 of the battery checker 10 faces the user when battery checker 10 is hung on a wall as described above. On the left-hand side portion of the front surface 101, the battery attachment portion 11 for attaching the electric tool battery B is provided. The battery attachment portion 11 is formed in correspondence with the electric tool battery B, which is detachably attached through sliding. A rechargeable battery is adopted as the electric tool battery B. The rechargeable battery is attached or detached by sliding with respect to the tool main body of the electric tool. The electric tool battery B is used as the power source of an electric tool when the electric tool battery B is attached to such a tool's main body. Examples of this type of electric tool to which the electric tool battery B is attached include electrically driven electric tools such as a driver, wrench, drill, reciprocating saw, chain saw, band saw, jig saw, circular saw, grinder, and tacker. Examples of the electric tool battery B include the product "BL1430," as listed in the Makita Comprehensive Catalog issued in April, 2012.

Schematically speaking, the battery attachment portion 11 has slide rails 12, a hook portion 13, a connection terminal portion 14, and a terminal cover 15. The electric tool battery B is attached to the battery attachment portion 11 by being caused to slide downwards from above, and is detached therefrom by being caused slide upwards from below. The slide rails 12 are guide rails which guide the electric tool battery B in sliding both when attaching/detaching the battery. The slide rails 12 are formed as an opposite-facing pair in a configuration corresponding to a reciprocal guide portion (not shown) formed on the electric tool battery B, and the slide rails 12 extend in the up/down direction in which the electric tool battery B may slide. The hook portion 13 is formed by a recessed hook. A protruding hook (not shown) of the electric tool battery B fits into the hook portion 13 of the battery attachment apparatus when the attachment of the battery has been completed. When the electric tool battery B is to be detached, a lock lever (not shown) on the electric tool battery B is operated to release the fit-engagement of the protruding hook of the electric tool battery B with respect to the hook portion 13 of the battery attachment apparatus.

The connection terminal portions 14 are provided at the center of the battery attachment portion 11. Corresponding terminals (not shown) on the electric tool battery B connect to the connection terminal portions 14. The connection terminal portions 14 are protected by a terminal cover 15. The terminal cover 15 is biased through the sliding at the time of the attachment/detachment of the electric tool battery B, whereby the terminal cover slides in the up/down direction. More specifically, when the electric tool battery B is attached to the battery attachment portion 11, the terminal cover 15 is pressed by the electric tool battery B and is lowered. Then, the connection terminal portions 14, which have heretofore been hidden, are now exposed, and connection terminals (not shown) provided on the electric tool battery B are connected to the connection terminal portions 14. The attachment of the electric tool battery B is effected through sliding the battery downwards from above, i.e., in the gravitational direction. In this manner, the electric tool battery B is easily attached to the battery attachment portion 11. Furthermore, even after the electric tool battery B attaches to the battery attachment portion 11, it is prevented from being easily detached from the battery attachment portion 11.

On the right-hand side portion of the front surface 101, a display output portion 17 and an operating portion 18 are provided. The display output portion 17 outputs and displays the above-mentioned diagnosis results so that the user can visually check them. The operating portion 18 includes buttons for user manipulation and operation of the display of the display output. By pressing the appropriate button of the operating portion 18, the user can accordingly change the display output as desired through the display output portion 17. On the right-hand side portion of the front surface 101, a power button 19 is also provided. The battery checker 10, to which the electric tool battery B is attached and through which the results of the diagnosis of the electric tool battery B are displayed and output, has a case as an exterior portion. The case 20 contains internal electronic components as appropriate.

The case 20 is formed in a rectangular configuration in plan view, and functions as an exterior portion and a casing. The composite case 20 is formed by joining a back case (lower case) 21 and a front case (upper case) 27. As shown in FIG. 3, the back case 21 and the front case 27 are integrally affixed to each other via male screws 28. More specifically, the back case 21 and the front case 27 are affixed to each other by the male screws 28 at the four corners of the rectangular configuration in plan view. The extension plane of the back case 21, coplanar with the up-down and right-left axes, constitutes a back surface 102 of the battery checker 10. The back surface 102 is the surface facing the wall when the battery checker 10 is hung on the wall.

A pair of lock holes 31 are formed in the back surface 102 of the back case 21. The pair of lock holes 31 enable the battery checker apparatus 10 to be hung on the wall. The pair of lock holes 31 include a left-hand side lock hole 311 provided in the vicinity of the left-hand side edge (the right-hand side edge in the drawing), and a right-hand side lock hole 312 provided in the vicinity of the right-hand side edge (the left-hand side edge in the drawing). The left-hand side lock hole 311 and the right-hand side lock hole 312 are collinear parallel to the right-left axis, and are provided symmetrical relative to each other about the up-down axis in the case 20 so that the battery checker 10 may be well-balanced in the right-left direction when it is hung on the wall. The left-hand side lock hole 311 and the right-hand side lock hole 312 are provided in a region corresponding to the upper half of the case 20 so that the battery checker may be well-balanced in the vertical direction when it is hung on the wall.

The left-hand side lock hole 311 and the right-hand side lock hole 312 consist of the same lock hole shapes 31. Thus, in the following description of the lock holes 31, only the right-hand side lock hole 312 will be described. A dry battery accommodating portion 23 that accommodates a dry battery is provided in the back surface 102 of the case 20.

The dry battery accommodating portion 23 is closed by an accommodation cover 24. The accommodation cover 24 is locked to the back case 21 by a lock hook 251, and is fastened thereto by a fastening screw 252. The lock holes 31 constitute a part of a lock structure 30.

Figure 11:
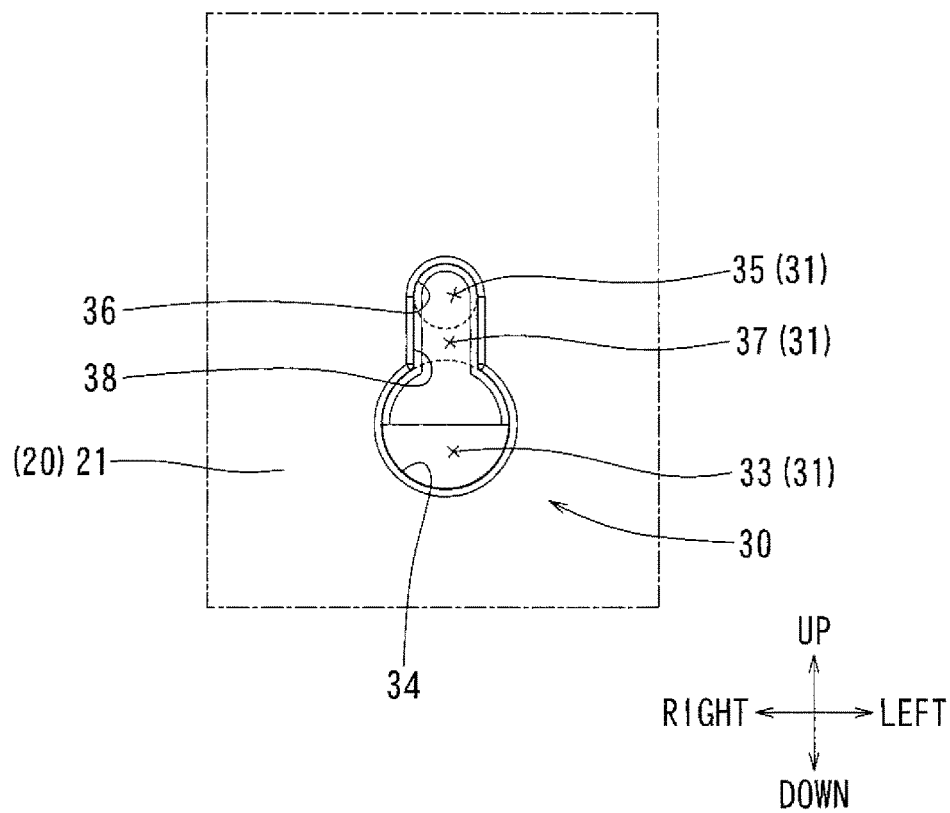
FIG. 11 is a front view of a lock hole from an exterior.
Figure 12:
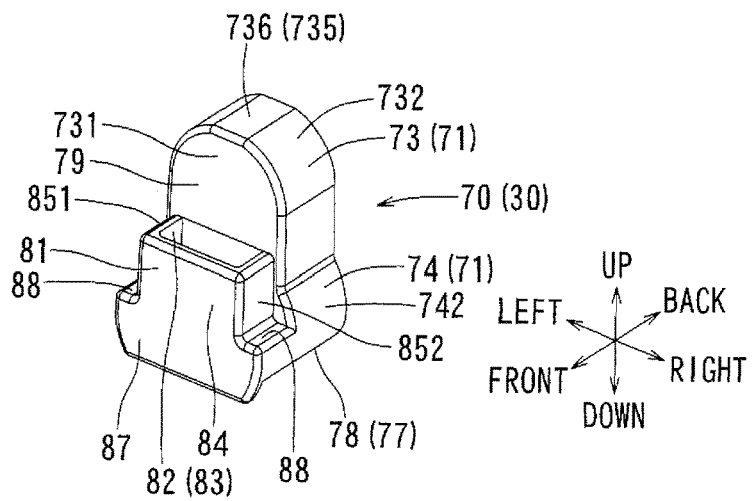
FIG. 12 is a perspective view of the cover member.
Figure 13:
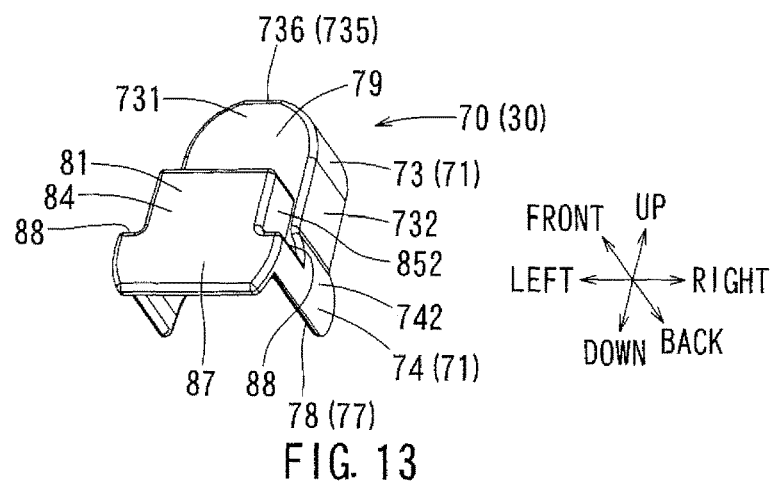
FIG. 13 is a perspective view of the cover member in a different direction from the view of FIG. 12.
Figure 14:
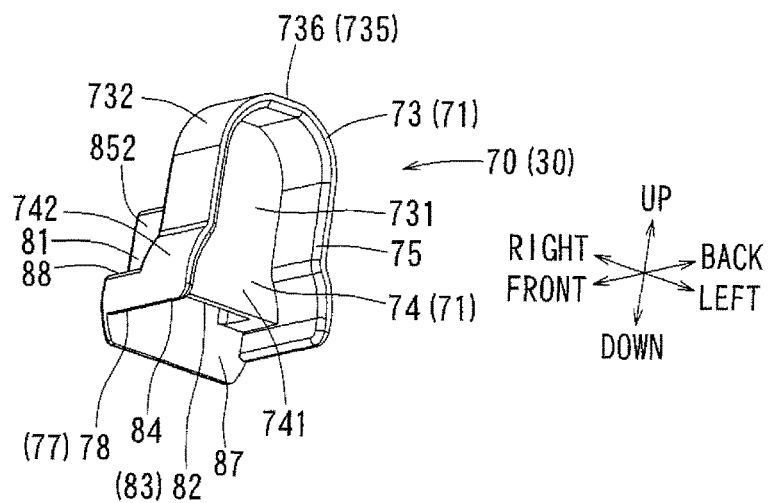
FIG. 14 is a perspective view of the cover member for illustrating an inside of the cover member.
Figure 15:
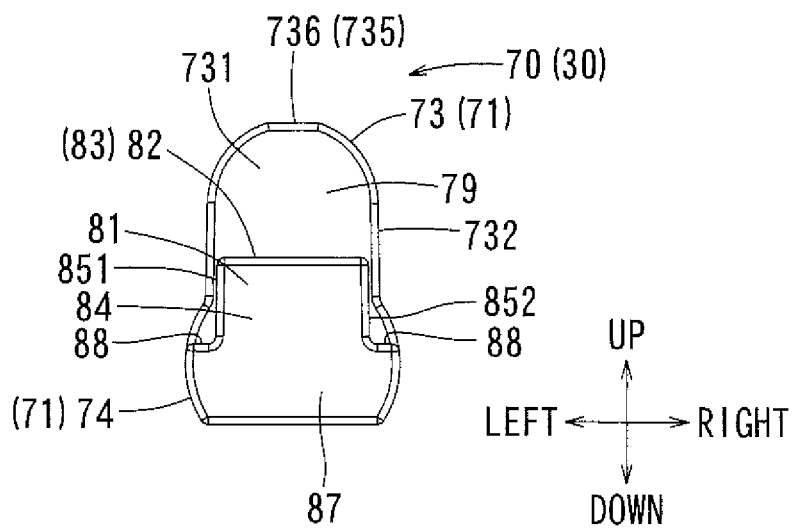
FIG. 15 is a front view of the cover member for illustrating an outside of the cover member.
Figure 16:
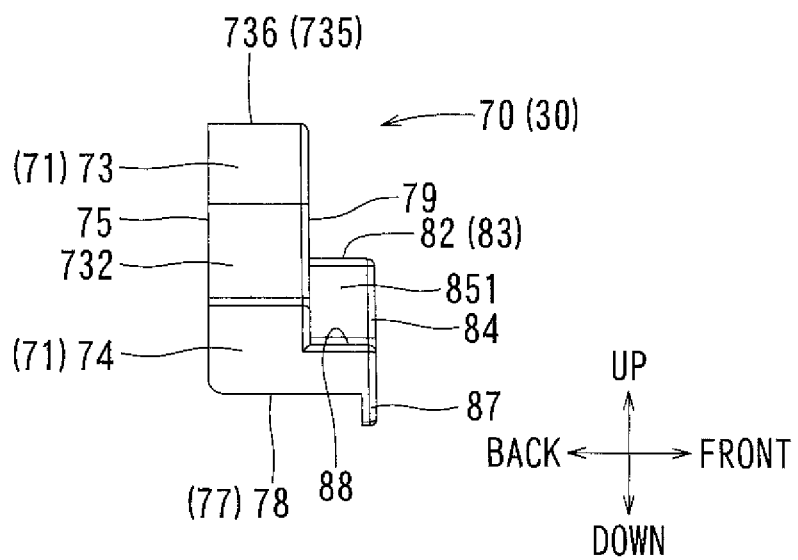
FIG. 16 is a left side view of the cover member.
Figure 17:
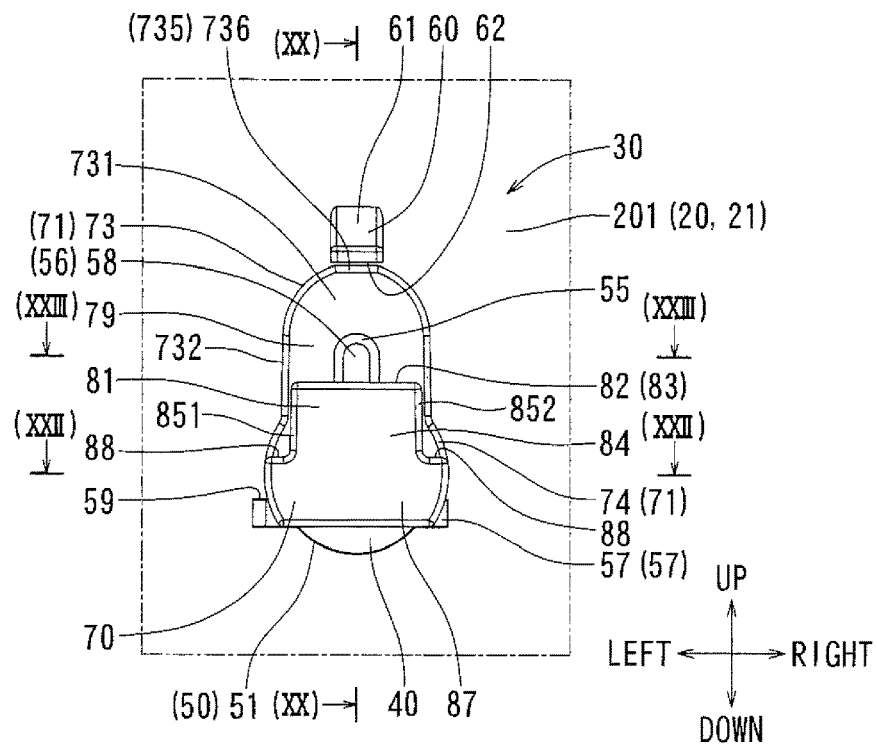
FIG. 17 is a front view of the lock structure after the cover member is mounted to the mounting portion.
Figure 18:
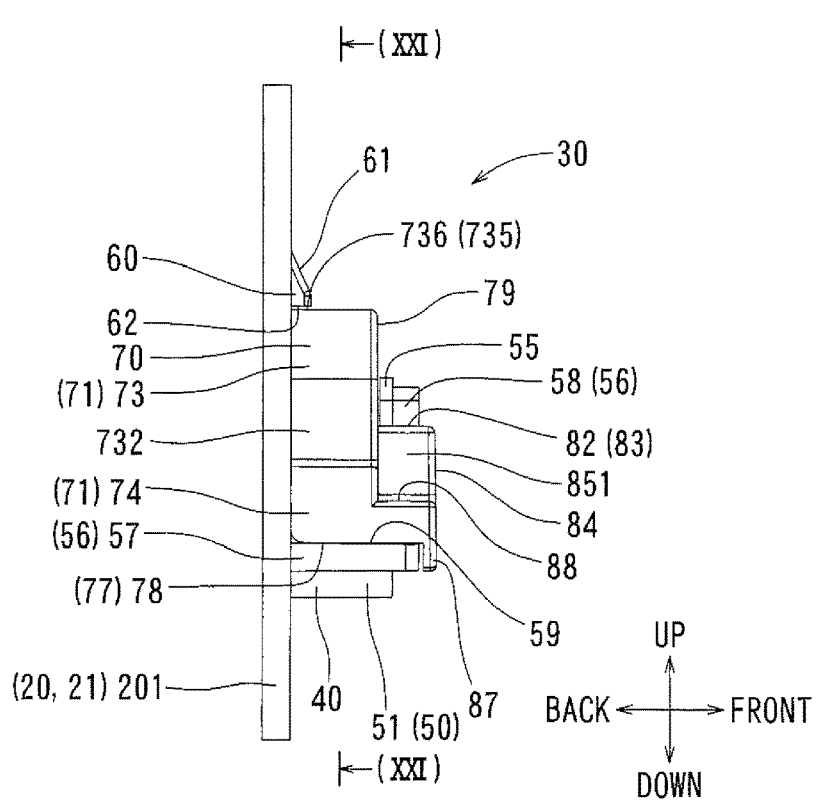
FIG. 18 is a left side view of the lock structure of FIG. 17.
Figure 19:
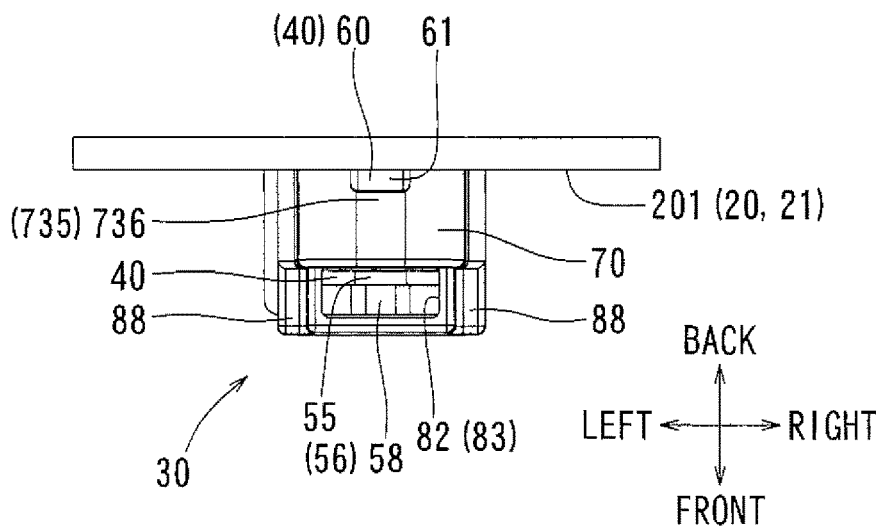
FIG. 19 is a plan view of the lock structure of FIG. 17.
Figure 20:
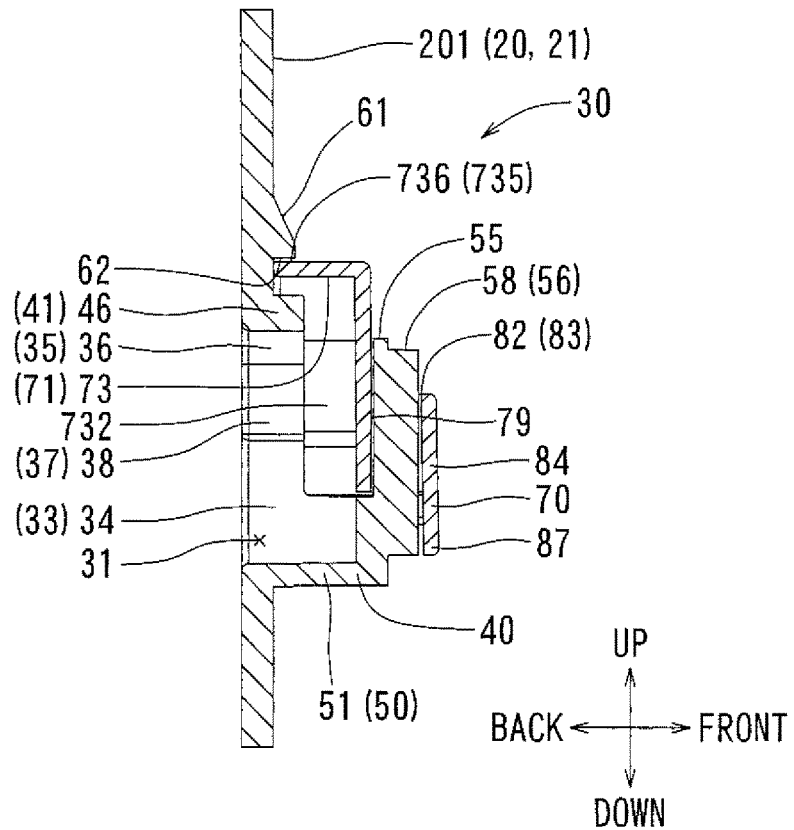
FIG. 20 is a cross-sectional view taken along line XX-XX in FIG. 17.
Figure 21:
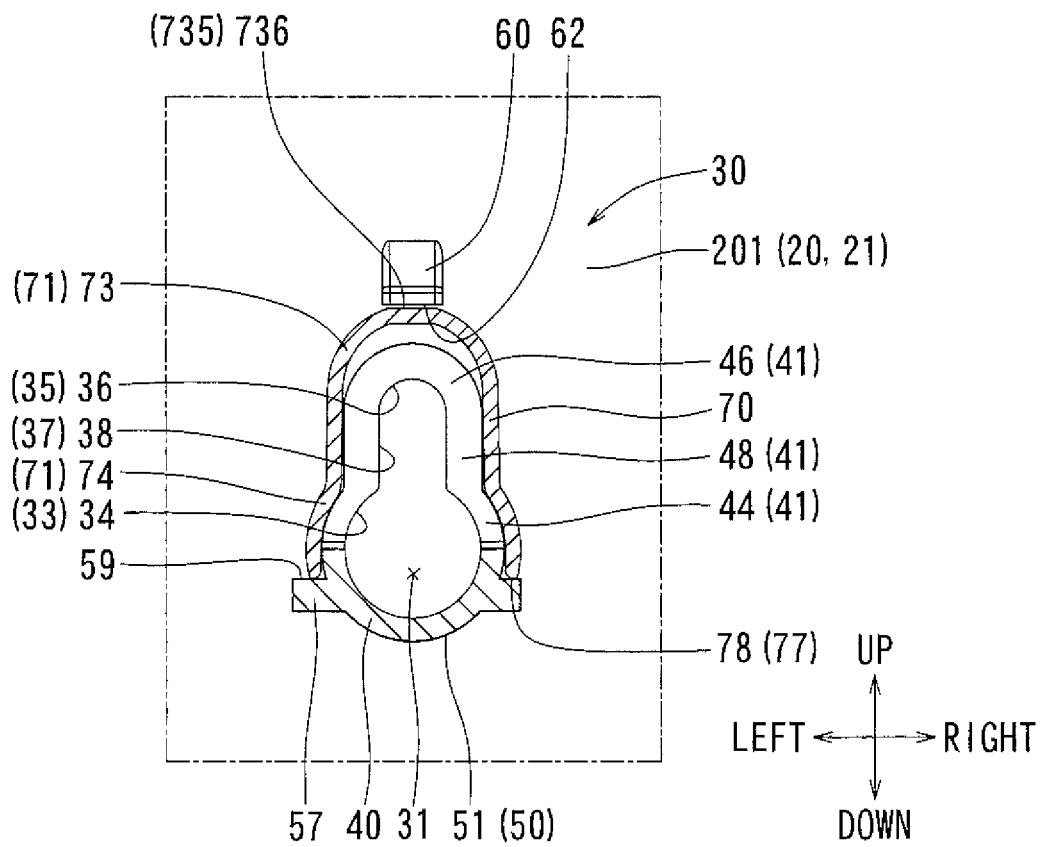
FIG. 21 is a cross-sectional view taken along line XXI-XXI in FIG. 18.
Figure 22:
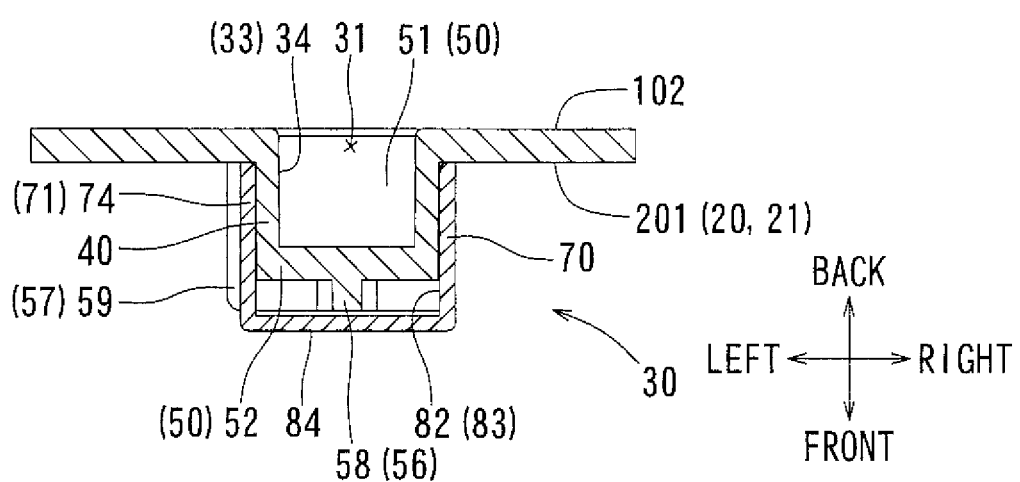
FIG. 22 is a cross-sectional view taken along line XXII-XXII in FIG. 17.
Figure 23:
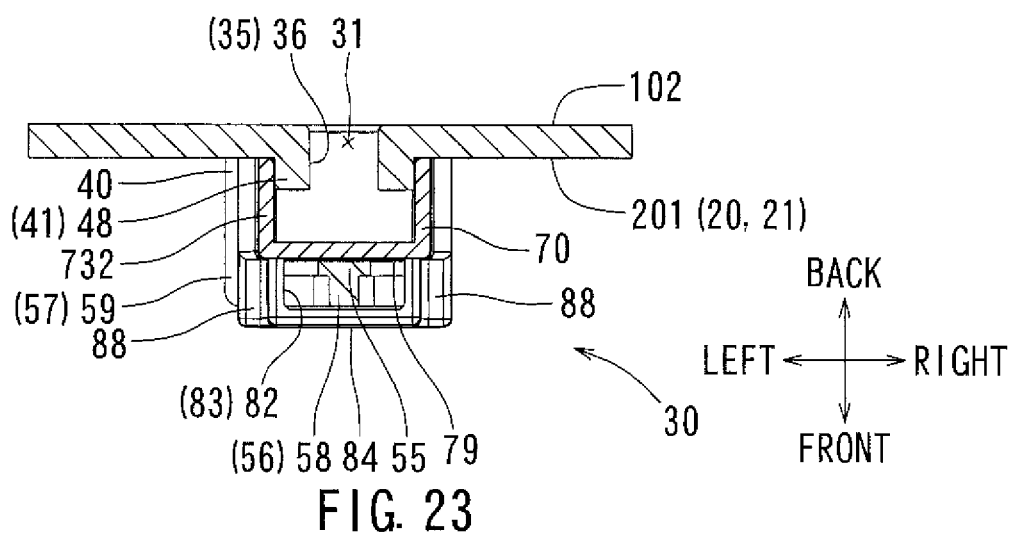
FIG. 23 is a cross-sectional view taken along line XXIII-XXIII in FIG. 17.

The lock structure 30 has the lock holes 31 provided in the back case 21, a mounting portion 40 provided on the back case 21, and a cover member 70 mounted to the mounting portion 40 (as shown in FIGS. 4-8). The lock holes 31 are formed so as to extend through the back surface 102 of the back case 21 from the back to the front of the back surface. That is, the lock holes 31 establish communication between the interior and exterior of the case 20 so as to allow insertion of an external male screw S (See FIGS. 25 and 27) into the interior of the case 20. The screw head S2 of the male screw S (external lock member) inserted into the interior of the case 20 from the lock hole 31 can be locked to the lock hole 31, Like widely used conventional male screws, the male screw S has the screw portion S1 and the screw head S2. The screw portion (leg portion) S1 is supported while embedded in the wall. As shown in FIG. 25, the screw head (lock head portion) S2 has an outer diameter larger than the outer diameter of the screw portion S1. Regarding the locking of the male screw S, it will be described below with reference to FIGS. 24 through 27. As shown in FIG. 11, the lock hole 31 is a communicating hole generally also referred to as a keyhole. The lock hole 31 is formed through the connection of two large and small holes 33 and 35 differing in diameter.

As shown in FIG. 11, the lower large-diameter hole 33 and the upper small-diameter hole 35 are connected together through an intermediary connection hole 37. The large-diameter hole 33 has an inner peripheral edge 34 of a relatively long arc-length around the longer diameter of 33, relative to the diameter of the small-diameter hole 35. The small-diameter hole 35 has an inner peripheral edge 36 of a relatively shorter arc length around the relatively short diameter as compared with the arc length and diameter of the large-diameter hole 33, respectively. The connection hole 37 has an inner peripheral edge 38 extending straight upwards into the small-diameter hole 35. The diameter corresponding to the arc length of the inner peripheral edge 34 of the large-diameter hole (first hole portion) 33 is large enough to allow insertion of the screw head S2 of the male screw S. The diameter corresponding to the arc length of the inner peripheral edge 36 of the small-diameter hole (second hole portion) 35 is of a size regulating detachment of the screw head S2 of the male screw S. The width of the inner peripheral edge 38 of connection hole 37 is of the same size as that of the diameter of the small-diameter hole 35. The small-diameter hole 35 and the large-diameter hole 33 are arranged vertically side by side and are continuous with each other through the intermediary connection hole 37.

As shown in FIGS. 5-10, a mounting portion 40 is provided on an inner surface 201 of the case 20 constituting the inner surface side of the lock hole 31. A cover member 70 is mounted to the mounting portion 40. The cover member 70 mounted to the mounting portion 40 closes the opening of the lock hole 31 from within the interior of case 20. The cover member 70 closes the lock hole 31, into which the male screw S is inserted, from within the case 20. The cover member 70 is mounted to the mounting portion 40 by being moved downwards from below, i.e., from the small-diameter hole 35 to the large-diameter hole 33. The mounting direction of the cover member 70 is downwards from above, i.e., the direction in which the inner surface 201 of the case 20 extends, indicated by the arrow in FIG. 5. By sliding the cover member 70 in this mounting direction, the cover member 70 is mounted to the mounting portion 40. The mounting portion 40 is provided on the inner surface 201 of the lock hole 31. Like the lock hole 31, the mounting portion 40 is provided in the interior of the case 20 comprising the same structure at both the left-hand side lock hole (indicated at 311) and the right-hand side lock hole (indicated at 312).

The mounting portion 40 will be described with reference to FIGS. 4 to 11. Schematically speaking, the mounting portion 40 has a protruding edge 41, a closing portion 50, a support guide portion 55, and a stopper portion 60. The protruding edge portion (first protruding edge) 41 is provided along the inner peripheral edges 34, 36, and 38 of the lock hole 31. The protruding edge 41 protrudes toward the interior of the case 20 from each of the inner peripheral edges 34, 36, and 38 of the lock hole 31. More specifically, 41 is comprised of subcomponents corresponding to the inner peripheral edges of the lock hole. A first protruding edge portion 44 is provided along the inner peripheral edge 34 of the large-diameter hole 33. A second protruding edge portion 46 is provided along the inner peripheral edge 36 of the small-diameter hole 35. A third protruding edge portion 48 is provided along the inner peripheral edge 38 of the connection hole 37. Like the inner peripheral edges 34, 36, and 38, which are contiguous, connected to each other, and collectively constitute the lock hole 31, similarly the first through third protruding edge portions 44, 46, and 48 are contiguous, connected to each other and collectively constitute the protruding edge 41, and protrude toward the interior of the case 20. The lower half of the first protruding edge portion 44 is formed so as to be continuous with the closing portion 50 described in detail below. The second and third protruding edge portions 46 and 48 and the upper half of the first protruding edge portion 44 protrude toward the interior of the case 20 by a distance corresponding to the thickness of the back case 21.

Figure 8:
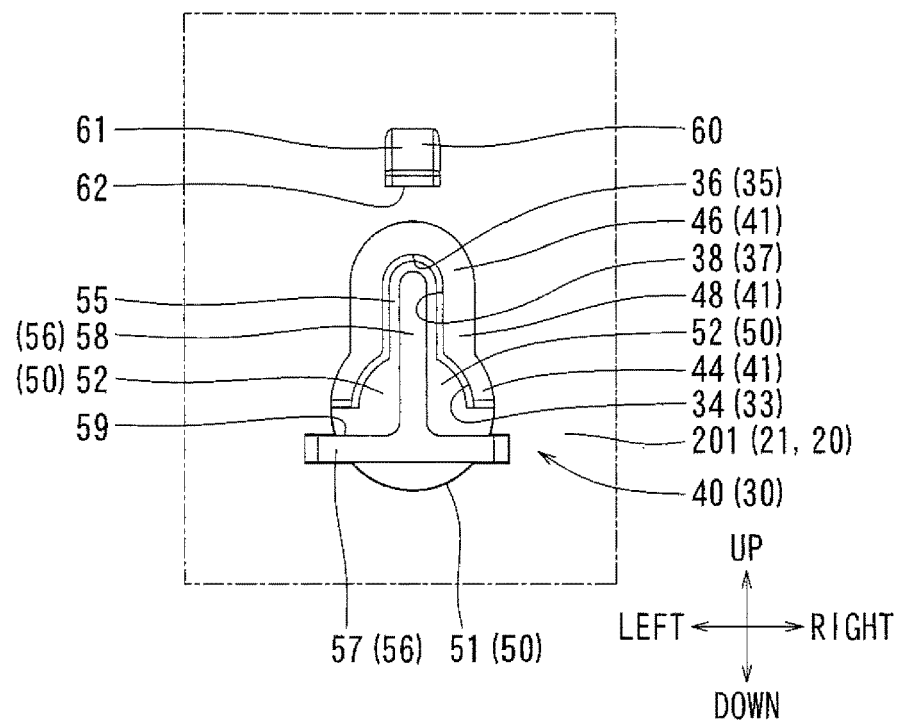
FIG. 8 is a front view of the mounting portion before the cover member is mounted to the mounting portion.

The closing portion 50 has a peripheral wall portion 51 and a circular portion 52. The peripheral wall portion 51 is formed so as to further protrude into the interior of the case 20 from the protruding edge 41 of the lower half of the large-diameter hole 33. The circular portion 52 is arranged opposite the large-diameter hole 33 so as to cover the large-diameter hole 33 while continuous with the peripheral wall portion 51. The peripheral wall portion 51 connects the lower half of the circular portion 52 that is arranged opposite the large-diameter hole 33 to the lower half of the inner peripheral edge 34 of the large-diameter hole 33. A support guide portion 55 extends upwards from the upper end of the circular portion 52. The support guide portion (mounting support portion) 55 extends upwards from below to a position that faces the lock hole 31. The support guide portion 55 supports and guides the cover member 70 as it moves downward toward the lock hole 31 from within the case 20. More specifically, the support guide portion 55 extends upwards from the upper end of the circular portion 52, and is arranged so as to face the upper small-diameter hole 35 and the intermediary hole 37. As shown in FIGS. 8 and 11, the circular portion 52 is formed such that it is slightly smaller than the opening of the large-diameter hole 33, and the support guide portion 55 is also formed slightly smaller than the opening of the small-diameter hole 35 and the connection hole 37, such that both the circular portion 52 and support guide portion 55 are approximately equidistant from the corresponding inner peripheral edges of the lock hole.

Figure 6:
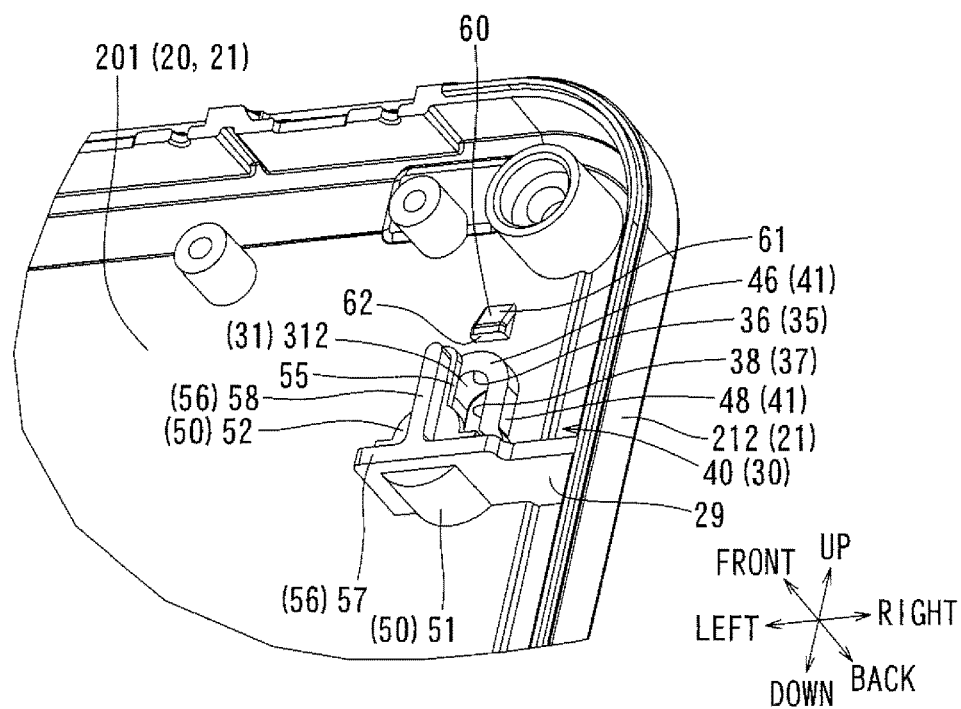
FIG. 6 is a perspective view of the mounting portion before the cover member is mounted to the mounting portion.
Figure 7:
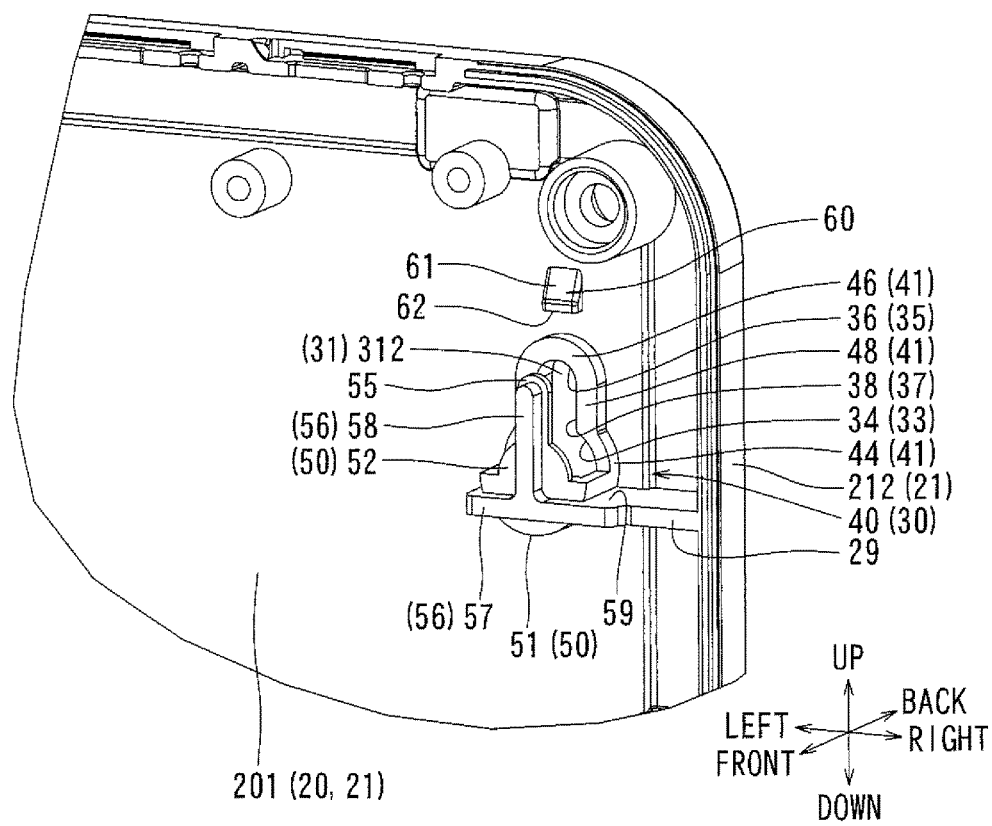
FIG. 7 is a perspective view of the mounting portion coplanar with the up-down and left-right axes before the cover member is mounted, in a different direction from the view of FIG. 6.
Figure 9:
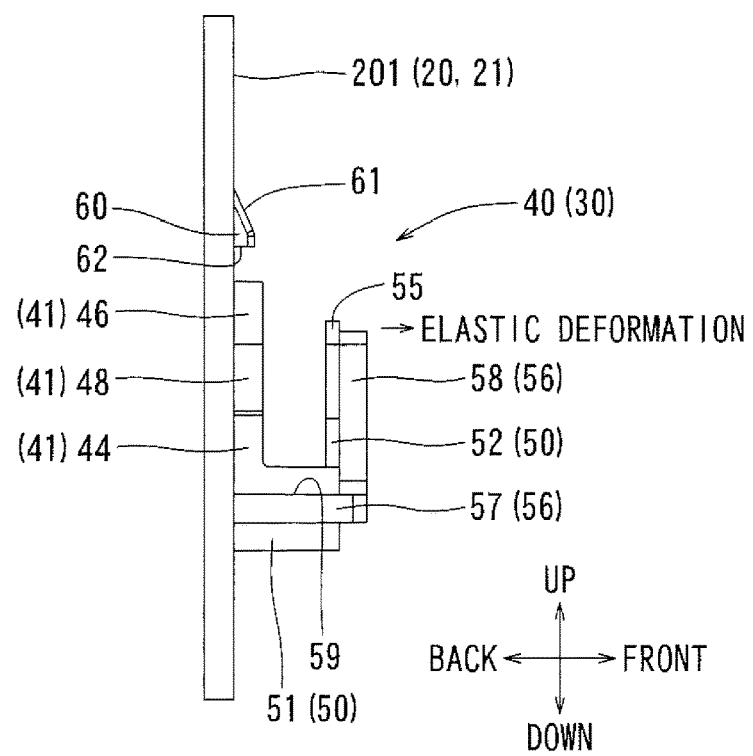
FIG. 9 is a left side view of the mounting portion before the cover member is mounted to the mounting portion.
Figure 10:
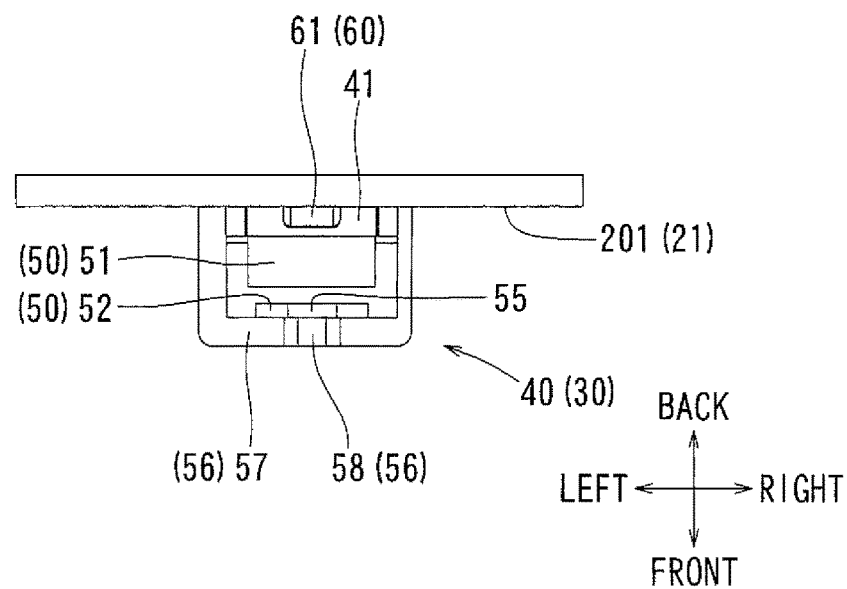
FIG. 10 is a plan view of the mounting portion before the cover member is mounted to the mounting portion.

A support rib 56 is provided on circular portion 52 and the support guide portion 55, which are part of the mounting portion 40 as described above, and are provided on the inner surface 201 of the case 20. The support rib 56 comprises a horizontal rib 57 extending in the horizontal direction, and a vertical rib 58 extending in the vertical direction. The horizontal rib 57 extends in the horizontal direction with respect to the lower vertical range of the closing portion 50. The vertical rib 58 extends in the vertical direction with respect to the upper vertical range of the closing portion 50 and extends into the vertical range of the support guide portion 55. The support guide portion 55 has an appropriate strength with respect to the closing portion 50 and the support guide portion 55. As shown in FIG. 9, the support rib 56 (comprising the horizontal rib 57 and the vertical rib 58) has a length in the back-front direction corresponding to the thickness of the back case 21. As shown in FIGS. 6 and 7, the horizontal rib 57 is continuous with a side rib 29 continuous with the left and right side walls 211 and 212 of the back case 21, for both the respective lock holes. When the cover member 70 has been mounted to the mounting portion 40, the upwardly facing surface of the horizontal rib 57 functions as a lower contact surface 59 that contacts with an opening end 78 of the cover member 70.

The stopper portion 60 is provided above the lock hole 31. The stopper portion 60 protrudes from the inner surface 201 of the case 20 toward the interior of the case 20. More specifically, as shown in FIG. 8, the stopper portion 60 is of a rectangular configuration as seen from the front view of the interior of the back surface. As shown in FIG. 9, the stopper portion 60 gradually protrudes toward the interior of the case 20 as the stopper portion 60 extends downwards from above. The stopper portion (detachment regulating portion) 60 regulates the detachment of the cover member 70 with respect to the mounting portion 40. More specifically, the surface of the stopper portion 60 facing the interior of the case 20 has a tapered surface 61 protruding downwardly toward the interior of the case 20. The tapered surface 61 functions as a guide surface when mounting the cover member 70 to the mounting portion 40. When mounting the cover member 70 to the mounting portion 40, the upper end 735 of the cover member is caused to climb over by virtue of the tapered surface 61. At this time, the support guide portion 55 undergoes slight elastic deformation toward the interior (the inner side) of the case 20. The support guide portion 55 supporting the cover member from within allows the mounting of the cover member 70 to the mounting portion 40 beyond the stopper portion 60. The cover member 70 thus climbs over the tapered surface 61, is able to bypass the stopper 60, and is arranged below the stopper portion 60, mounted to the mounting portion 40.

The surface of the stopper portion 60 facing the lower side of the case 20 includes an upper contact surface 62 that faces the lower contact surface 59. The upper contact surface 62 is formed by a step of the protruding stopper portion 60 in the back-front direction toward the interior. When the cover member 70 has been mounted to the mounting portion 40, the upper contact surface 62 regulates movement in the detachment direction of the cover member 70. That is, the upper contact surface 62 supports the cover member 70 with respect to the mounting portion 40 so as to hold the cover member 70 together with the lower contact surface 59 providing a friction-fit, since the lower contact surface 59 and the upper contact surface 62 extend in a direction orthogonal to the inner surface 201 of the case 20. When the cover member 70 mounted to the mounting portion 40 strives to move upwards from below, the contact surface 736 of the cover member 70 abuts the upper contact surface 62 of the stopper portion 60, and sliding of the cover member 70 is regulated by said friction-fit. As a result, detachment of the cover member 70 with respect to the mounting portion 40 is regulated and is prevented from easily occurring.

The cover member 70 is made of molded resin. As shown in FIGS. 12 to 20, the cover portion 71 is of an outer peripheral configuration substantially matched with the opening configuration of the lock hole 31 (a keyhole-shaped configuration as seen from the front view, e.g. in FIG. 3), and is of a cover-shaped configuration closing the opening of the lock hole 31. Schematically speaking, the cover member 70 has a cover portion 71 and an insert guide portion 81. More specifically, the cover portion 71 is formed by a first cover portion 73 and a second cover portion 74 vertically continuous with each other. The first cover portion 73 covers the opening of the small-diameter hole 35 and of the intermediary connection hole 37. The first cover portion 73 has a first facing portion 731 facing and arranged so as to cover the small-diameter hole 35 and the intermediary connection hole 37, and a first peripheral wall portion 732 constituting a peripheral wall along the outer periphery of the first facing portion 731. The first peripheral wall portion 732 extends in a side wall form from the peripheral edge of the first facing portion 731. The upper end 735 of the first peripheral wall portion 732 is a contact surface 736 that the upper contact surface 62 of the stopper portion 60 abuts and interfaces with, where 62 is of a rectangular face configuration.

The second cover portion 74 covers the opening of the upper half of the large-diameter hole 33. The second cover portion 74 has a second facing portion 741 facing and arranged so as to cover the upper half of the large-diameter hole 33, and a second peripheral wall portion 742 constituting a peripheral wall along the outer periphery of the second facing portion 741 (See FIG. 14). The second peripheral wall portion 742 extends from the peripheral edge of the second facing portion 741 in a side wall configuration. The cover member 70 is provided with openings 75 and 77 for its mounting to the mounting portion 40. That is, the cover member 70 is provided with a facing opening 75 provided in the portion of the interior of the cover member 70 facing the lock hole 31, and a lower opening 77 provided in the lower vertical portion of the interior of the cover member. The facing opening 75 is set by an edge facing the back side of the first and second peripheral wall portions 732 and 742. The lower opening 77 is set by an edge facing the lower side of the second peripheral wall portion 742. The lower opening 77 is of a configuration capable of accommodating the protruding edge 41 and the closing portion 50 of the mounting portion 40. The lower end of the lower opening 77 is the open end 78 of the cover member 70 abutting the lower contact surface 59 of the mounting portion 40.

The outer peripheral surface 79 of the cover portion 71 is provided with the insert guide portion 81 continuous with the cover portion 71. The insert guide portion 81 faces the lower-half range of the cover portion 71. The insert guide portion 81 and the cover portion 71 are formed continuously in two inner and outer parallel stages, parallel in the back-front direction. The insert guide portion 81 has an insert hole 82 into which the support guide portion 55 of the mounting portion 40 is inserted. The support guide portion 55 is fitted into the insert portion 83 upwards from below, as the cover portion 71 moves downward, indicated by the directional arrow in FIG. 5. The insert guide portion 81 has the insert portion 83 where the insert hole 82 is set, and an extension portion 87 covering the lower portion of the mounting portion 40. The insert portion 83 has a facing wall 84 which faces the outer peripheral surface 79 of the cover portion 71.

A left-hand side wall 851 and a right-hand side wall 852 connecting the facing wall 84 and the outer peripheral surface 79 are provided on the left-hand side and the right-hand side peripheral regions of the facing wall 84. The vertically extending insert hole 82 is thus provided between the facing wall 84 and the outer peripheral surface 79 which face each other, between the left-hand side wall 851 and the right-hand side wall 852. An extension portion 87 provided below the facing wall 84 extends so as to cover the lower portion of the mounting portion 40. The extension portion 87 extends downwards to face and cover the circular portion 52 of the mounting portion 40. The outer peripheral portions on the right and left sides of the insert portion 83 are provided with a pair of step portions 88 on the right-hand and left-hand sides. The step portions 88 fill the gap between the facing wall 84 and the protruding edge 41 (when mounted), and by filling said gap they shield the exterior from static electricity and increase the total along-the-surface distance from the exterior of the case 20 to a board (circuit board) provided within the case 20 to enhance the air-tightness of the case 20. As a result, the electrical insulation performance of the board installed within the case 20 is enhanced with respect to the exterior of the case 20. When the electrical insulation performance is thus improved, exposure of static electricity from the exterior of the case 20 onto the board installed inside the case 20 does not easily occur, making it possible to suppress a device malfunction and circuit failure.

The cover member 70 mounted to the mounting portion 40 as described above is provided with a structure which overlaps with the mounting portion 40. That is, the first peripheral wall portion 732 and the second peripheral wall portion 742 of the cover member 70 overlap the first through third protruding edge portions 44, 46, and 48 (comprising protruding edge 41) provided on the mounting portion 40 in the thickness direction of the first peripheral wall portion 732 and the second peripheral wall portion 742. The first through third protruding edge portions 44, 46, and 48 are provided along the inner peripheral edges 34, 36, and 38 of the lock hole 31. The open end 78 of the cover member 70 overlaps the horizontal rib 57 provided on the mounting portion 40 in the thickness direction of the horizontal rib 57. That is, the cover member 70 mounted to the mounting portion 40 is formed so as to overlap the periphery of the lock hole 31 in the thickness direction. The construction of the cover member. 70 and the mounting portion 40 is such that their overlap is contiguous over the entire periphery of the lock hole 31, wherein the overlapping length substantially coincides with the plate thickness (see infra) of the case 20.

Figure 24:
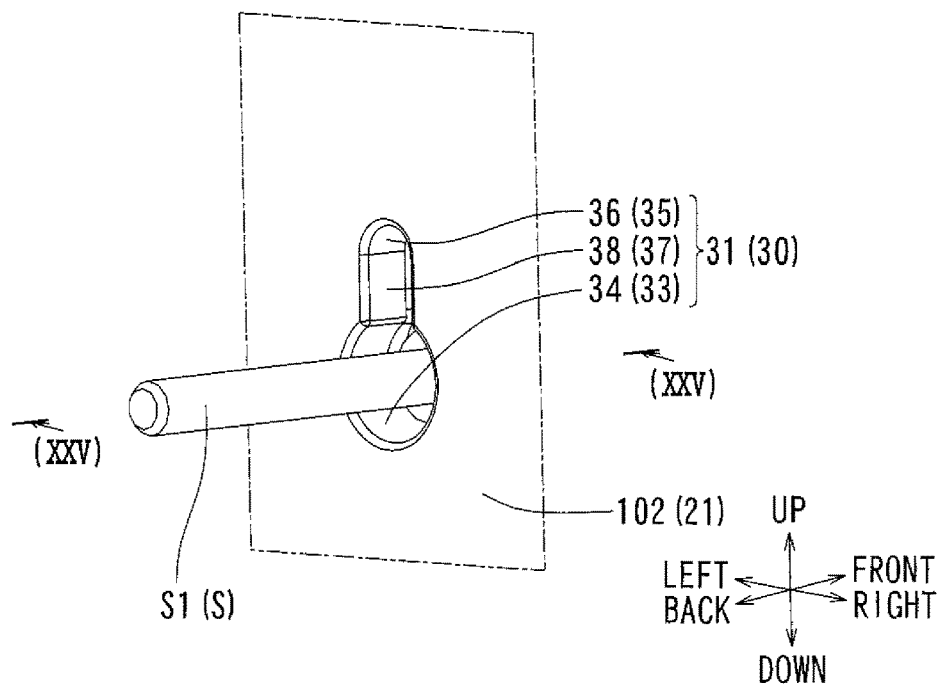
FIG. 24 is an outside perspective view of the lock hole to which a male screw is inserted.
Figure 25:
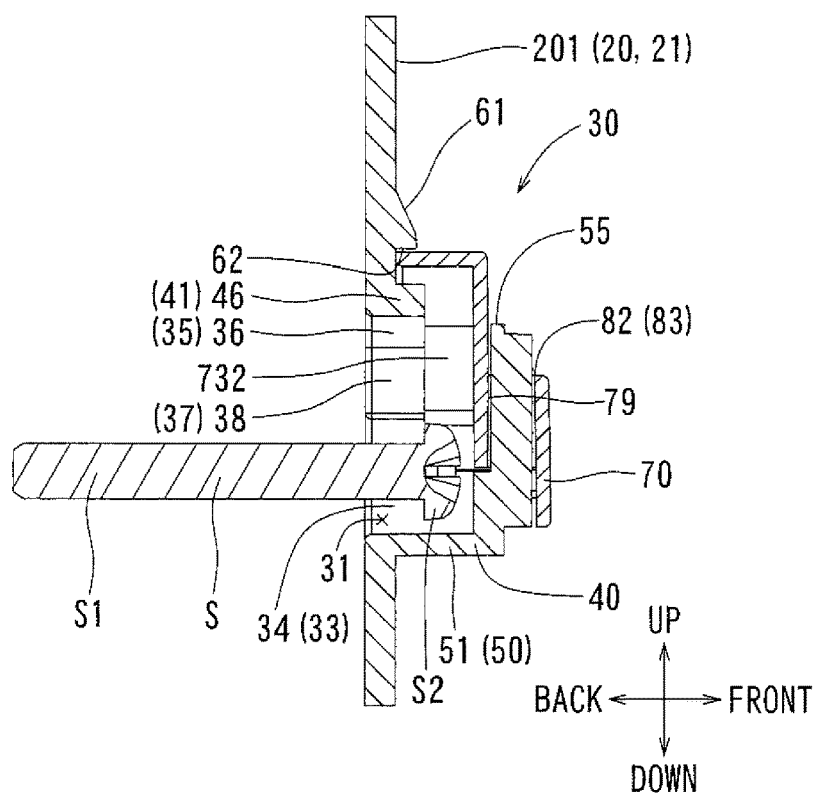
FIG. 25 is a cross-sectional view taken along line XXV-XXV in FIG. 24.
Figure 26:
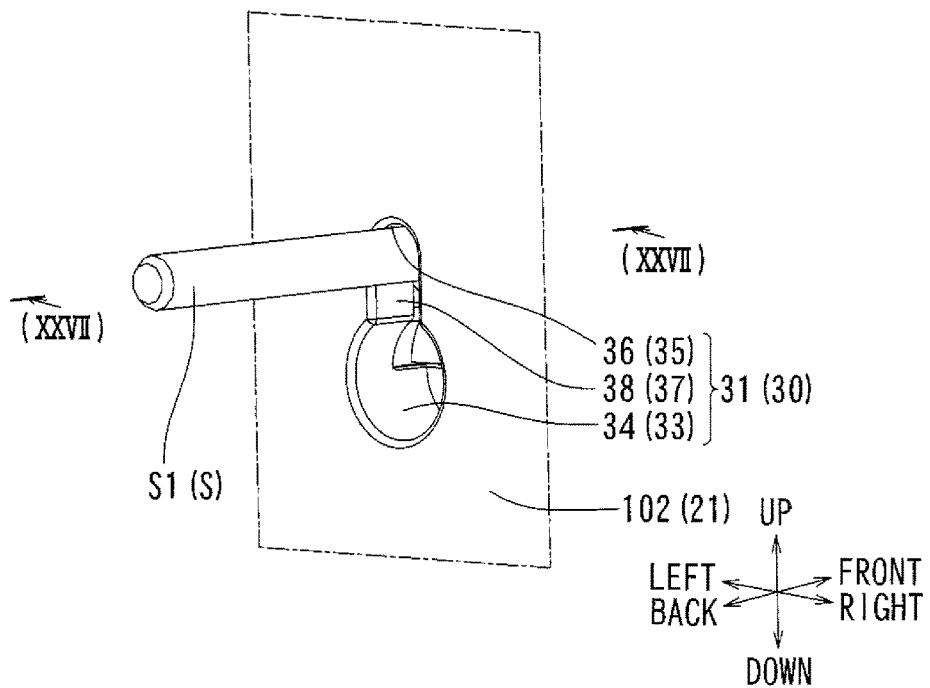
FIG. 26 is an outside perspective view of the lock hole to which the male screw is inserted.
Figure 27:
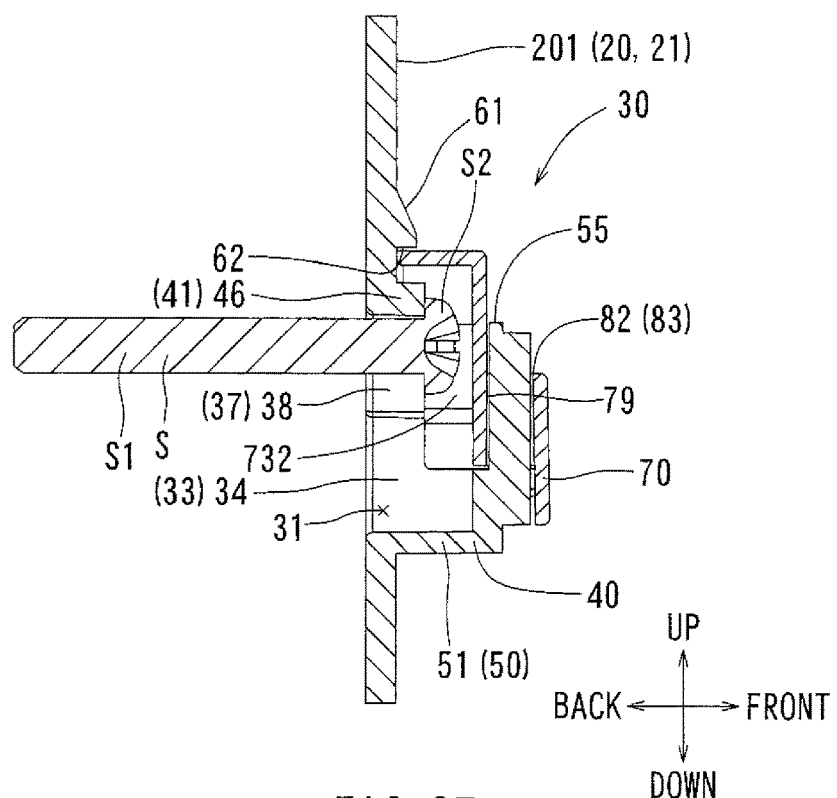
FIG. 27 is a cross-sectional view taken along line XXVII-XXVII in FIG. 26.

As shown in FIGS. 24 to 27, the male screw S is engaged with the lock hole 31. More specifically, as shown in FIGS. 24 and 25, the male screw S is first inserted into the large-diameter hole 33 of the lock hole 31. The male screw S is a conventional male screw type used in general wall-hanging applications, where screw S is fixed in position by screwing its screw portion S1 through the wall. The large-diameter hole 33 has an inner peripheral edge 34 allowing the insertion of the screw head S2 of the male screw S. When the battery checker apparatus 10 is caused to slide downwards with respect to the male screw S, the state as shown in FIGS. 26 and 27 is attained. That is, the male screw S moves to the small-diameter hole 35 from the large-diameter hole 33 via the intermediary connection hole 37. The diameter of the inner peripheral edge 36 of the small-diameter hole 35 is of a size regulating detachment of the screw head S2 of the male screw S. Thus, the screw head S2 of the male screw S is locked to the lock hole 31.

The battery checker apparatus 10 is of the wall-hanging type, where it may be hung on the wall by inserting the screw portion S1 of the wall-hanging male screw S into the lock hole 31. The cover member 70 mounted to the mounting portion 40 can fully enclose the opening of the lock hole 31 from within the interior of case 20, providing an interior depth to the enclosure. As a result, the cover member 70 can prevent intrusion of foreign matter and static electricity from the exterior into the interior of the case through the lock hole 31, thereby preventing a possible malfunction of the product due to the intrusion of such foreign matter as well as static electricity.

The support guide portion 55 is provided at a position that faces the lock hole 31, and supports the cover member 70 from within toward the lock hole 31. As a result, even when foreign matter imposes a pressing force upon the cover member 70 at least partially in the front direction through the lock hole 31, the cover member 70 is supported by the support guide portion 55 and is able to absorb the force without easily being detached. Thus, the cover member 70 is firmly fortified against the intrusion of foreign matter from the outside, enhancing the malfunction-prevention capabilities of the product. The cover member 70 is mounted to the mounting portion 40 by moving it in the extending direction of the inner surface 201 along the inner surface 201 of the case 20 downward with respect to the mounting portion 40. Thus, the support guide portion 55 constitutes no obstacle, and the cover member 70 may be mounted to the mounting portion 40. As a result, the cover member 70 may be mounted to the mounting portion 40 easily and reliably.

The cover member 70 is provided with a structure into which the support guide portion 55 is fitted, so that it is possible to enhance the support of the cover member 70 by the fortification provided by support guide portion 55. As a result, the cover member 70 may be mounted to the mounting portion 40 more reliably. The stopper portion 60 may regulate detachment of the cover member 70 with respect to the mounting portion 40. As a result, the cover member 70 is firmly maintained in the mounted state with respect to the mounting portion 40. The stopper portion 60 can perform the mounting of the cover member 70 without interference from the support guide portion 55, where such interference is prevented by the elastic deformation of the support guide portion 55. Thus, the cover member 70 is mounted easily.

The cover member 70 is mounted to the mounting portion 40 by being moved downwards from above with respect to the mounting portion 40. Thus, the downwards mounting direction of the cover member 70 coincides with the gravitational direction. As a result, detachment of the cover member 70 may be further suppressed. The first peripheral wall portion 732 and the second peripheral wall portion 742 of the cover member 70 overlap the first through third protruding edge portions 44, 46, and 48 (protruding edge 41) provided on the mounting portion 40 in the thickness direction of the first peripheral wall portion 732 and the second peripheral wall portion 742. Thereby, the edge of the opening of the lock hole 31 may be fully enclosed through the friction-fit overlapping. As a result, the closing along-the-surface distance from the lock hole 31 to the interior of the case 20 is increased and enhances the degree of air-tightness. Thus, intrusion of foreign matter and static electricity into the interior of the case 20 from the lock hole 31 may be further suppressed. The battery checker 10 may be hung on the wall by inserting the wall-hanging male screw S into the lock hole 31. As a result, the battery checker 10 may be hung on the wall by utilizing a general-use male screw as the lock member.

Regarding the above, the battery checker 10 has been described as an exemplary embodiment of the battery attachment apparatus. The battery attachment apparatus may be constructed in other forms, such as a charger for recharging an electric tool battery. Also, instead of the above construction, the cover member may be of some other construction and configuration in which it is mounted on the mounting portion set on the case inner surface so as to close the opening of the lock hole from within the case. For example, the cover member 70 may be mounted to the mounting portion by being moved in the right-left direction with respect to the lock hole 31 instead of the downwards direction as described above. Additionally, the cover member 70 may be mounted to the mounting portion by being moved in the facing direction with respect to the lock hole 31. The mounting portion may also be constructed, for example, such that there is no stopper portion 60. Alternatively, instead of the construction in which the movement in the vertical direction is regulated by the stopper, the detachment regulating portion may be of a construction which regulates movement in the right-left direction.

The battery attachment apparatus is of a portable type. Thus, the user may inadvertently drop the battery attachment apparatus. When the battery attachment apparatus is dropped, for example, the display output portion (liquid crystal display panel) of the battery attachment apparatus may suffer damage. Thus, there is a need for a battery attachment apparatus where the liquid crystal display panel can withstand damage. In view of this need, the battery attachment apparatus may adopt, instead of or in addition to the above construction, the following described construction A.

As described above, an electric tool battery is attached and detached to and from the battery attachment apparatus. In construction A, the battery attachment apparatus has, for example, a liquid crystal display panel for displaying the condition of the electric tool battery, an LCD case retaining the back surface of the liquid crystal panel, an LCD cover which covers the surface of the liquid crystal display panel, where said cover is formed of a transparent material and is attached to the LCD case, and a case having a window opening through which the LCD cover is accessible. In this construction, within the case, the attachment is such that the LCD cover is not mounted to the case but rather the LCD case that is mounted to the case.

Due to the added structural shielding by the LCD cover and case of this construction, the liquid crystal display panel is able to withstand damage and is not easily affected by external force. When, for example, the case receives a force and is distorted, the distortion is transmitted from the case to the liquid crystal display panel via the LCD case. The force applied to the liquid crystal display panel is transmitted to the liquid crystal display panel after first being mitigated and substantially diminished by the LCD case. In this way, because the LCD case diminishes the force transmitted to the liquid crystal panel, damage to the liquid crystal display panel is suppressed. There are also cases where the LCD cover receives a force. Because of the method of attachment of the cover to the LCD case as described above, such force is transmitted from the LCD cover to the liquid crystal display panel via the LCD case. Thus, here again the force applied to the liquid crystal display panel is transmitted to the liquid crystal display panel only after being mitigated by the LCD case. As a result, the force transmitted to the liquid crystal display panel here too is substantially diminished by the LCD case, and in this manner the damage of the liquid crystal display panel is vastly suppressed.

In the battery attachment apparatus of construction A, one of the LCD case and the LCD cover may have a claw to be hooked on a lock portion formed on the other. Thus, the claw rationally connects the LCD case and the LCD cover. For example, the LCD cover is situated on the front side of the LCD case. Thus, any force received by the LCD cover is directed to the LCD case, and can be received by the LCD case. Thus, the LCD cover and the LCD case may be connected to each other with a relatively small force large enough not to cause detachment. Accordingly, it is possible to connect the LCD case and the LCD cover by the claw, which is a relatively simple structure.

In the battery attachment apparatus of the above construction A, the LCD cover may have a curved surface the central portion of which protrudes further in the front direction than the peripheral portion thereof, forming a parabolic distribution. In this manner, the LCD cover is subject to damage due to external force to a relatively lesser degree. When, for example, an external force is applied to the central portion of the LCD cover, the force is dispersed to the outer periphery due to the curved parabolic surface, and thus the external force can be distributed over a wider area, enhancing the mitigation and diminishing of the force.

In the battery attachment apparatus of construction A, the LCD case may have a protrusion formed along the periphery of the opening window in the front direction protruding outwards beyond the LCD cover. Due to its protruding outward to a greater degree, the protrusion is likely to receive an external force earlier than the LCD cover. As a result, the external force received by the LCD cover is diminished, and damage or the like to the LCD cover can also be mitigated and suppressed.

In the battery attachment apparatus of construction A, the battery attachment apparatus may have an operating button, a controller, and a cable. The operating button is operated in order to switch the display on the screen of the liquid crystal display panel, and is provided on the case so as to be situated in the vicinity of one edge of the liquid crystal display panel. The controller is provided on the case and transmits a signal to the liquid crystal display panel. The cable extends from the other edge on the opposite side of the edge near the operating button and connects the liquid crystal display panel and the controller.

In this construction, no cable is arranged between the liquid crystal display panel and the operating button. As described above, the operating button is provided close to the liquid crystal display panel. The operating button can be easily operated in accordance with the display on the liquid crystal display panel. The cable between the LCD panel and the controller is thus provided without being affected by the small space between the liquid crystal display panel and the operating button. In this manner, the cable can connect the liquid crystal display panel and the controller in a relatively large space.

In the battery attachment apparatus of construction A, the case has a back case and a front case attached to the back case and having an opening window. The LCD case may be attached to the front case. This makes it possible to position the LCD case and the liquid crystal display panel with respect to the opening window of the front case accurately and easily.

In the battery attachment apparatus of construction A, as described above, the case has a back case, and an attached front case having an opening window. The back case may be provided with a controller transmitting a signal to the liquid crystal display panel, and an LCD case to which the liquid crystal display panel is attached. Thus, both the liquid crystal display panel and the controller are attached to the back case. As a result, it is possible to electrically connect the liquid crystal display panel and the controller before the front case is attached to the back case, where the LCD case may then be attached to the front case as described above.

The above construction will be described in detail below with reference to the drawings. As shown in FIG. 1, the battery checker 10 is an example of the battery attachment apparatus, and has a case 20 and a display output portion 17. The case 20 is equipped with a back case 21 and a front case 27 attached to the back case 21, and the display output portion 17 is provided in the case 20.

Figure 28:
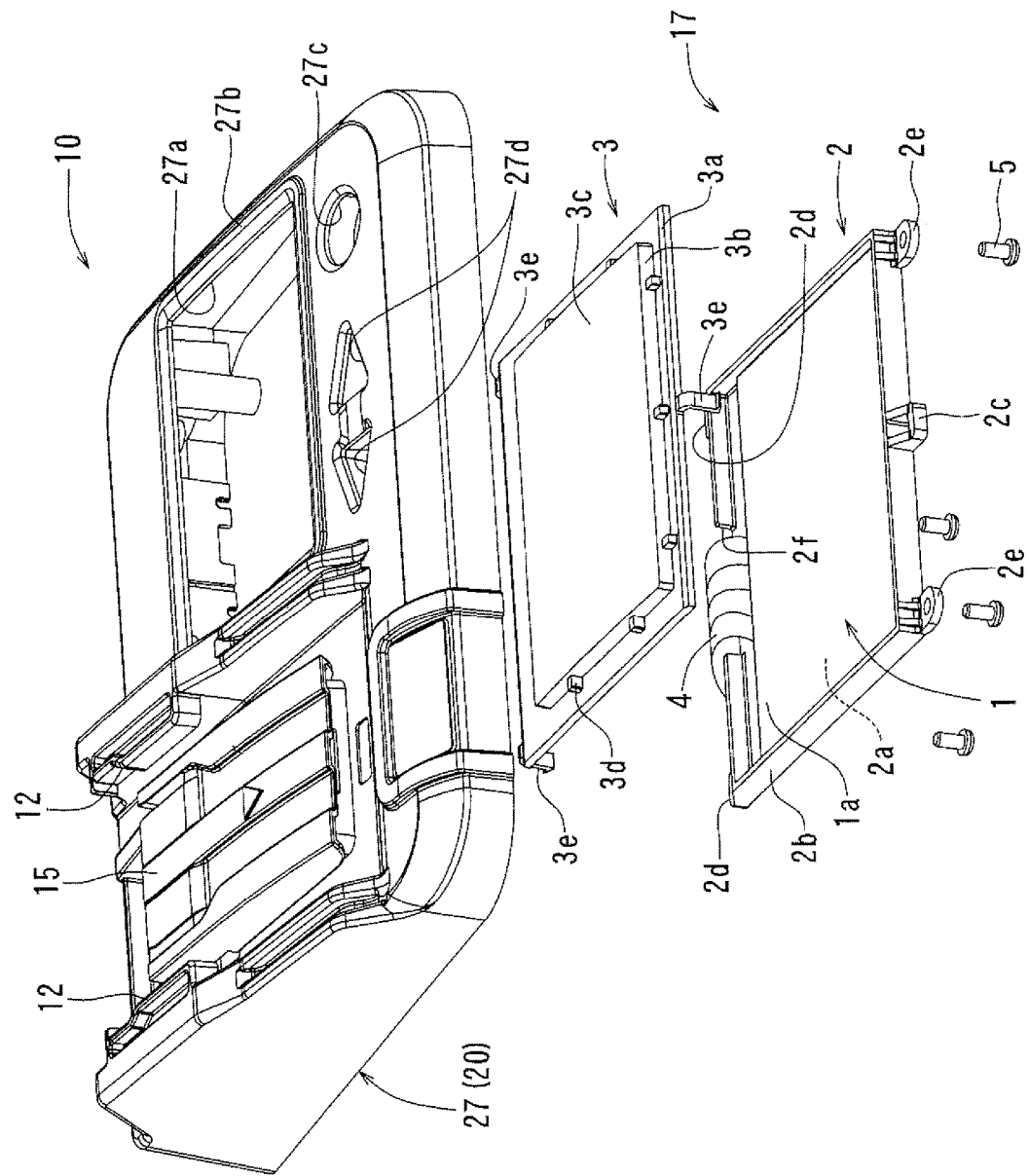
FIG. 28 is an exploded perspective view of a front case and a display output portion from front thereof.

As shown in FIG. 28, the display output portion 17 has a liquid crystal display panel (LCD panel) 1, an LCD case 2, and an LCD cover 3. The liquid crystal display panel 1 is formed as a rectangular plate, and displays diagnosis results, etc. from the data gathered on the electric tool battery B obtained by the battery checker 10. The LCD case 2 is formed as a dish, and has a main body plate 2a retaining the liquid crystal display panel 1. The back surface of the liquid crystal display panel 1 is bonded or attached to the front surface of the main body plate 2a by an adhesive or the like.

Figure 29:
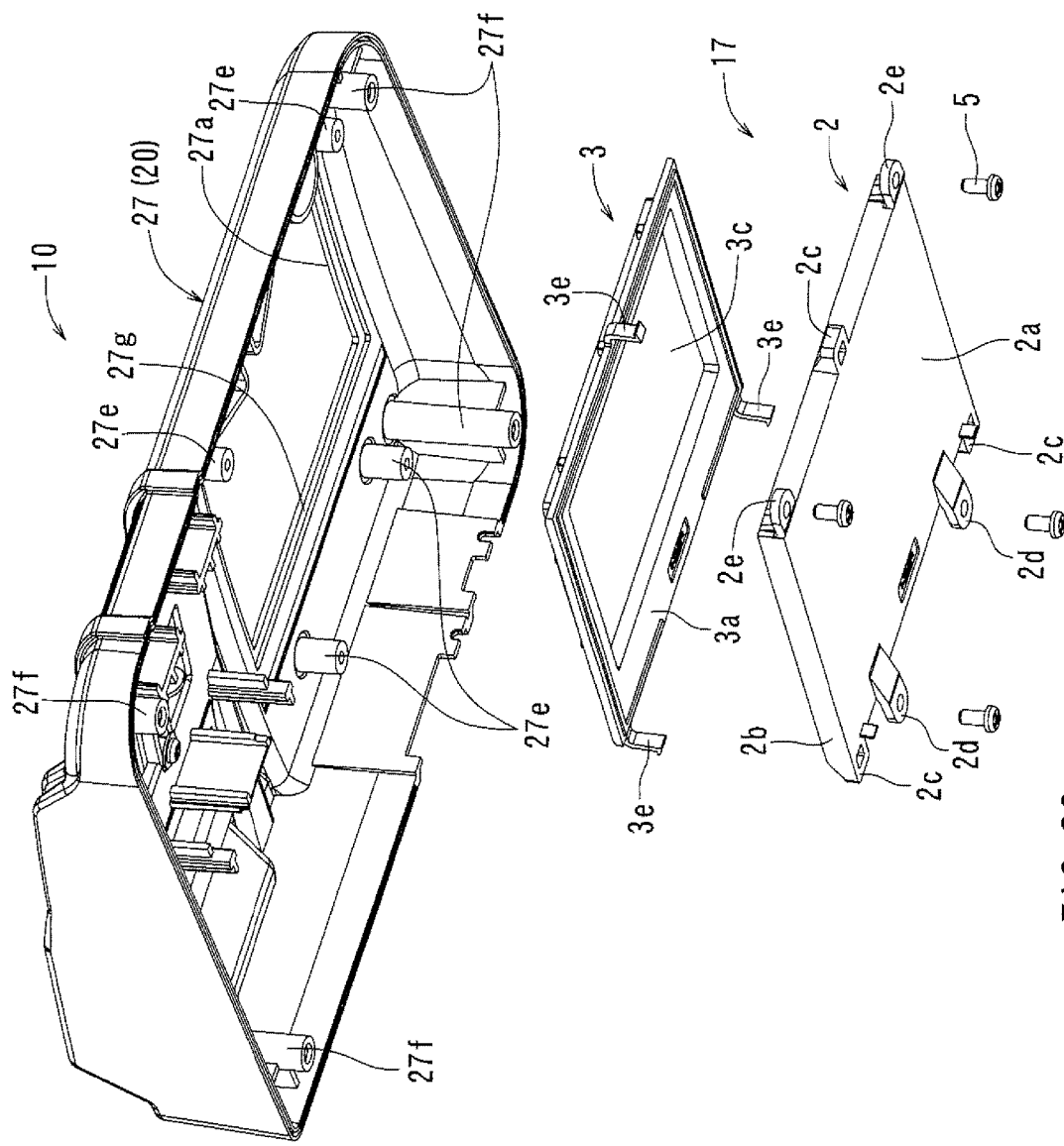
FIG. 29 is an exploded perspective view of the front case and the display output portion from a viewpoint underneath the case.

As shown in FIGS. 28 and 29, the LCD case 2 has a wall portion 2b extending along the outer periphery of the main body plate 2a. The wall portion 2b has a height larger than the thickness of the liquid crystal display panel 1, and thus can protect the outer periphery of the liquid crystal display panel 1. The wall portion 2b has a cutout 2f at the upper edge of the main body plate 2a, and a cable 4 is passed through the same. The cable 4 consists, for example, of a flat ribbon cable. The cable 4 extends from the upper edge of the liquid crystal display panel 1 through the cutout 2f, and is connected to a circuit board 6 shown in FIG. 33.

As shown in FIGS. 28 and 29, the LCD cover 3 is attached to the LCD case 2. The LCD case 2 has lock portions 2c protruding outwardly from the wall portion 2b. The lock portions 2c include, for example, lock portions 2c protruding upwards from the upper edge left portion and the upper edge right portion of the wall portion 2b, and a lock portion 2c protruding downwards from the lower edge central portion of the wall portion 2b. Each lock portion 2c has a through-hole through which a claw 3e of the LCD cover 3 is passed.

Figure 30:
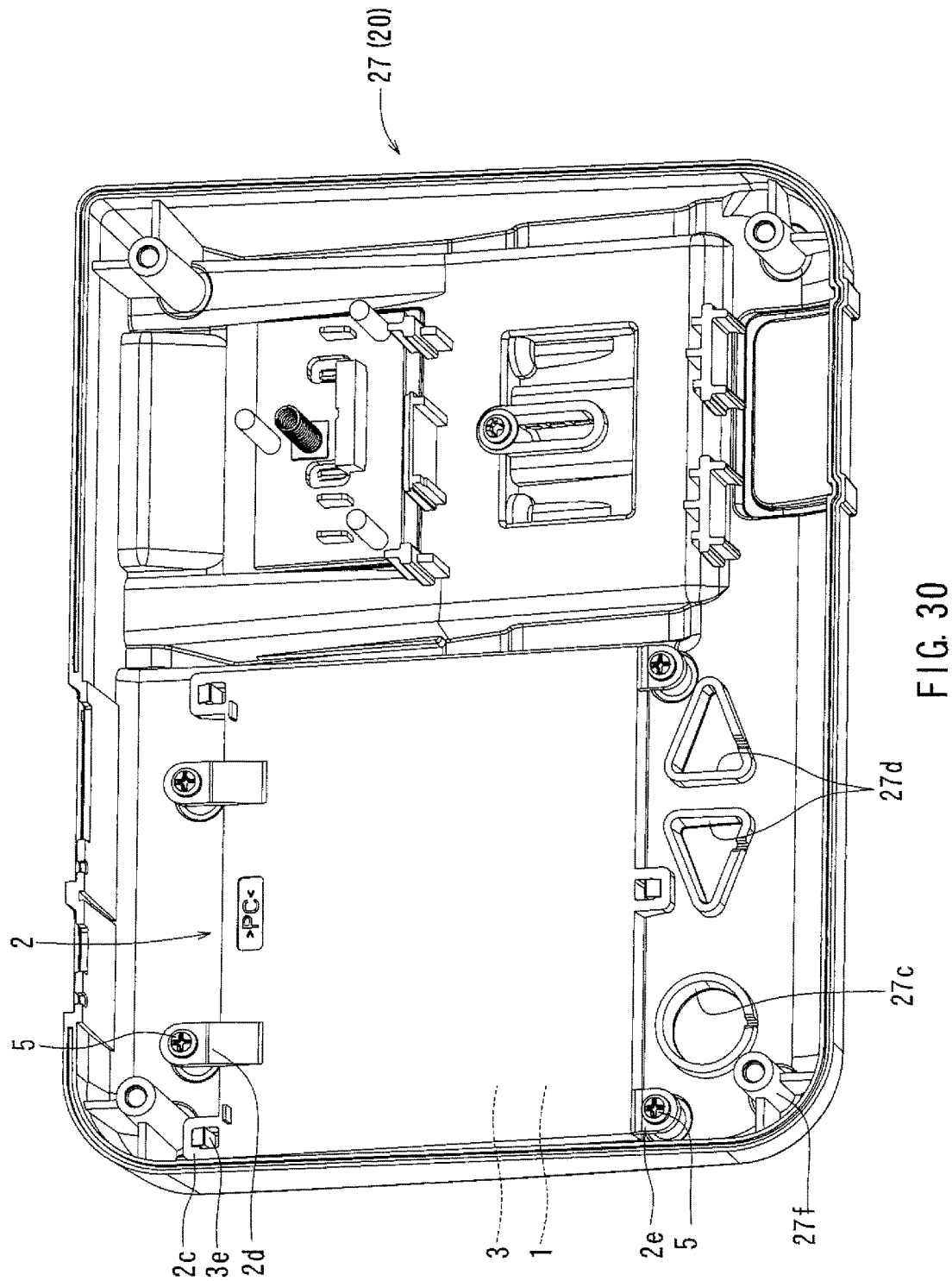
FIG. 30 is a bottom view of the front case and the display output portion.

As shown in FIGS. 28 and 29, the LCD case 2 is attached to the front case 20. The LCD case 2 has a plurality of attachment portions 2d and 2e protruding outwardly from the wall portion 2b. The attachment portions 2d extend upwardly from the back surfaces of the upper left region and the upper right region of the main body plate 2a. The attachment portions 2e protrude downwardly from the lower left portion and the lower right portion of the wall portion 2b. Each of the attachment portions 2d and 2e have through-holes through which the leg of a screw 5 is passed. The legs of the screws 5 are threadedly engaged with bosses 27e protruding backwards from the back surface of the front case 27, and the heads of the screws 5 retain the attachment portions 2d and 2e. As shown in FIG. 30, due to this construction, the LCD case 2 is attached to the front case 27 by the screws 5.

Figure 31:
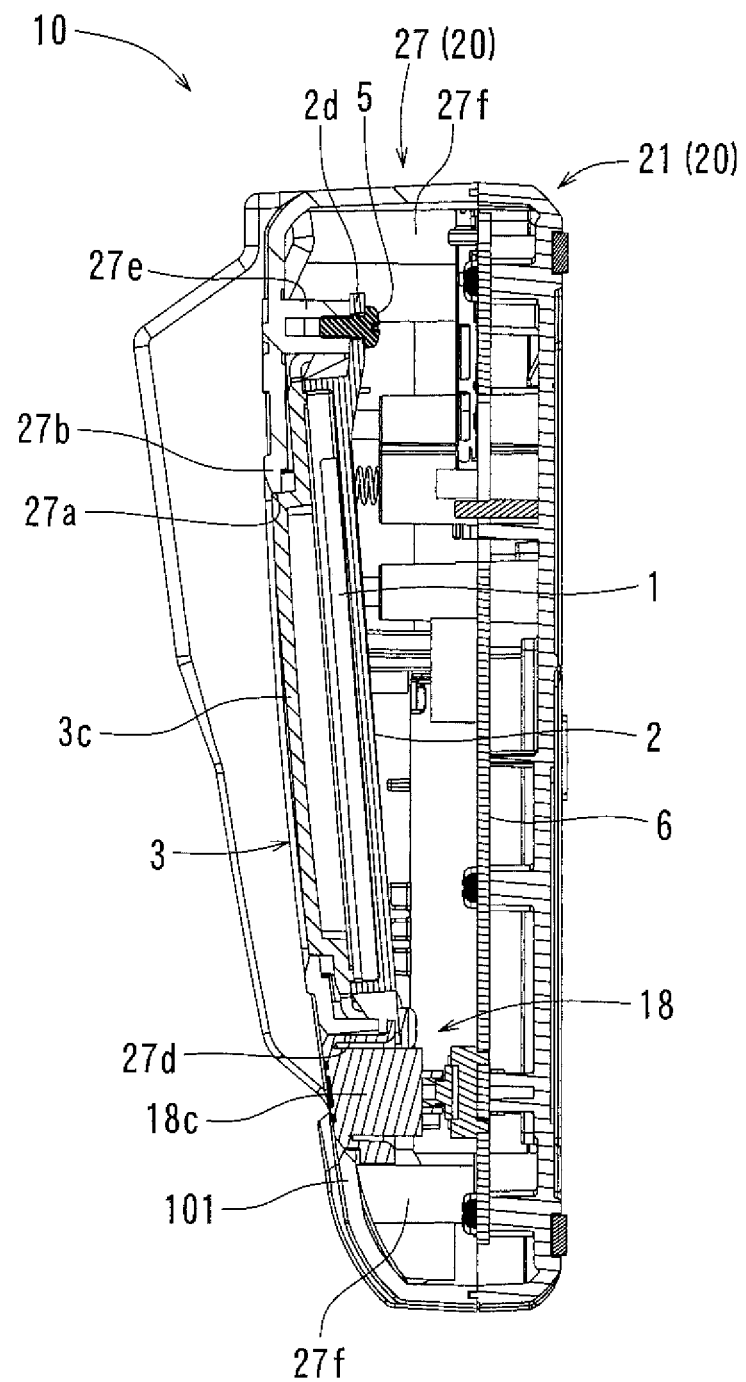
FIG. 31 is a cross-sectional view taken along line XXXI-XXXI in FIG. 1.

As shown in FIGS. 28 and 29, the LCD cover 3 is formed as a rectangular plate of a highly transparent resin. The LCD cover 3 has a main body portion 3c that is open through an opening window 27a, a flange portion 3a extending along the outer periphery of the main body portion 3c, and claws 3e for attaching the LCD cover 3 to the LCD case 2. As shown in FIG. 31, the main body portion 3c of the LCD cover 3 is attached within the opening window 27a, and is of a configuration in conformity with a front side surface 101 of the front case 27. Thus, the LCD cover 3 is superior in outward appearance from the viewpoint of design. The main body portion 3c is situated somewhat on the inner side of the front side surface 101 of the front case 27. Thus, the main body portion 3c does not easily receive external force as described above, and thereby the LCD cover 3 does not easily suffer damage.

As shown in FIG. 31, the surface of the main body portion 3c of the LCD cover 3 is of a configuration in conformity with the front side surface 101 of the front case 27, and the central portion thereof has a curved surface where the center of said surface along its longitudinal length protrudes more in the front direction than the upper and lower portions to its sides. Thus, when the main body portion 3c receives a force, the force is dispersed along the curved surface and is thus mitigated. Additionally, as shown in FIG. 28, the front case 27 has a protrusion 27b protruding in the front direction along the outer periphery of the opening window 27a. Thus, due to the protrusion being further in the front direction, 27b receives the external force earlier than the LCD cover 3, whereby it is possible to further mitigate the application of the external force to the LCD cover 3.

As shown in FIGS. 28 and 29, the flange portion 3a of the LCD cover 3 is situated on the back of the main body portion 3c, and extends in an annular fashion along the main body portion 3c. A positioning protrusion 3d adjacent to the outer peripheral edge of the main body portion 3c is formed on the surface of the flange portion 3a. The protrusion 3d of the cover is installed in a recess 27g formed in the back surface of the front case 27 along the opening window 27a. The surface of the protrusion 3d contacts with the bottom surface of the recess 27g or an area adjacent to the bottom surface, whereby the positioning the LCD cover 3 and the front case 27 in the front-back direction is determined. The outer peripheral end of the protrusion 3d contacts with the peripheral wall of the recess 27g or an area proximal to said wall, whereby said protrusions aid in positioning the LCD cover 3 with respect to the front case 27 in the vertical and right-left directions in a friction-fit configuration.

As shown in FIGS. 28 and 29, the LCD cover 3 has a plurality of claws 3e for being mounted to the LCD case 2. The claws 3e extend backwards from the upper edge left portion, the upper edge right portion, and the lower edge central portion of the LCD cover 3. Each claw 3e has a distal end protruding outwards. When they are inserted into the lock portions 2c of the LCD case 2 from the front to the back, the claws 3e undergo elastic deformation and restoration, whereby their distal ends are engaged with the lock portions 2c. The claws 3e prevent the LCD cover 3 from being detached to the front with respect to the LCD case 2. Further, the claws 3e are capable of elastic deformation in the vertical direction, and retain the LCD cover 3 elastically in the vertical direction with respect to the LCD case 2. At the same time, the claws 3e are not easily elastically deformed in the right-left direction, and regulate the amount by which the LCD cover 3 is moved in the right-left direction with respect to the LCD case 2.

As shown in FIGS. 28 and 29, the back surface of the flange portion 3a of the LCD cover 3 abuts the front end of the wall portion 2b of the LCD case 2. Thus, the LCD case 2 supports the LCD cover 3 from the back. Thus, when the LCD cover 3 receives an external force from the front, in diminishing and mitigating said force, the LCD cover 3 is supported from the back by the wall portion 2b of the LCD case 2.

Figure 33:
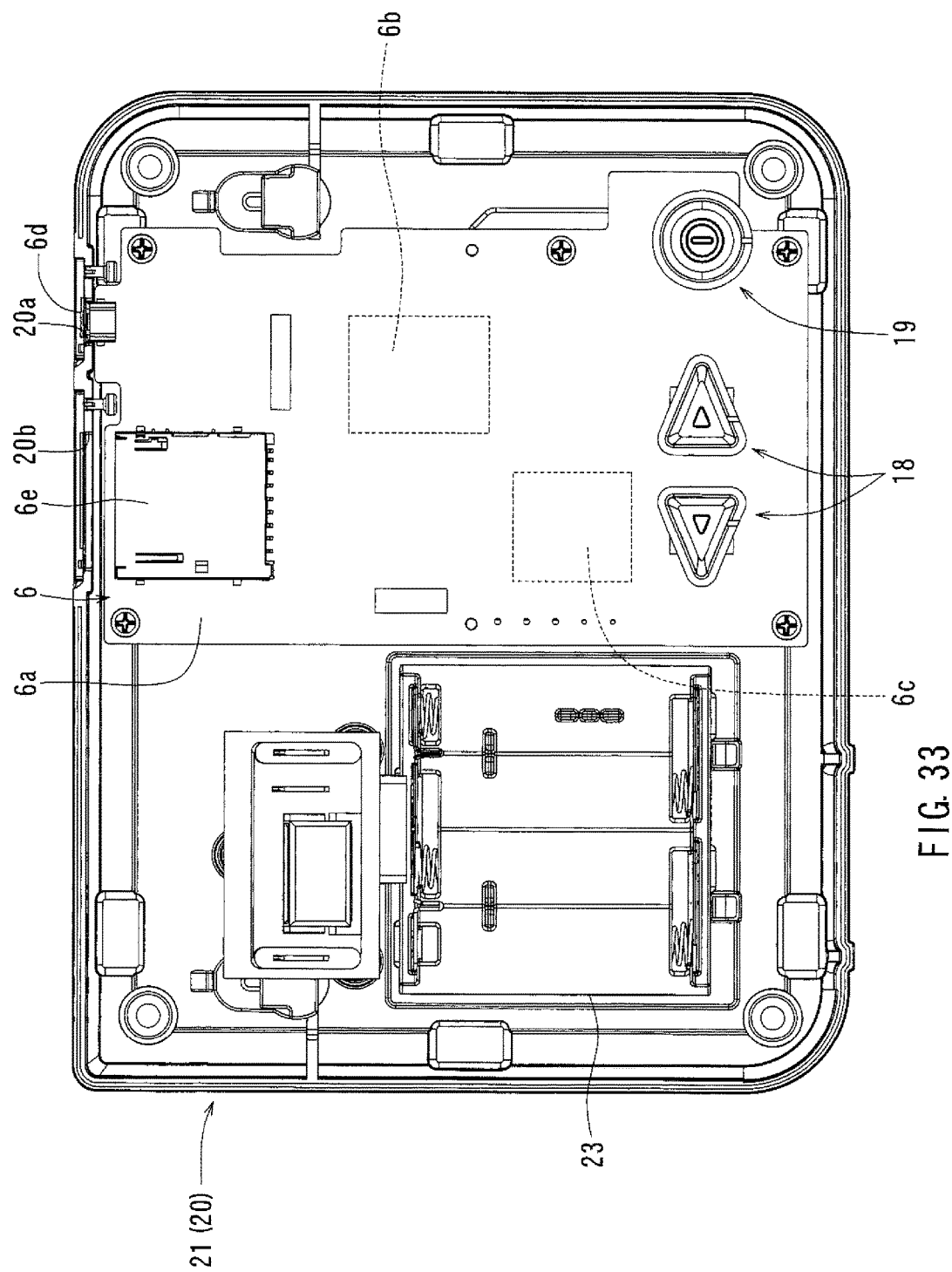
FIG. 33 is a top view of the interior of the case and members that are mounted on the interior of the case, from a viewpoint underneath.

As shown in FIG. 33, the circuit board 6 has a board main body 6a, a controller 6b, and a discharge circuit 6c. The controller 6b consists, for example, a micro controller (MCU), and is connected to the battery B attached to the battery checker 10 and shown in FIG. 2 so as to allow communication therewith. The controller 6b has a program (firmware) diagnosing the condition of the battery B based on a communication signal transmitted from the battery B, and flash memory storing an algorithm, etc. The discharge circuit 6c is connected to the battery B, and enables discharge of the battery B. The controller 6b also may diagnose the battery B by measuring the discharge capacitance of the battery B at the time of discharge.

Figure 36:
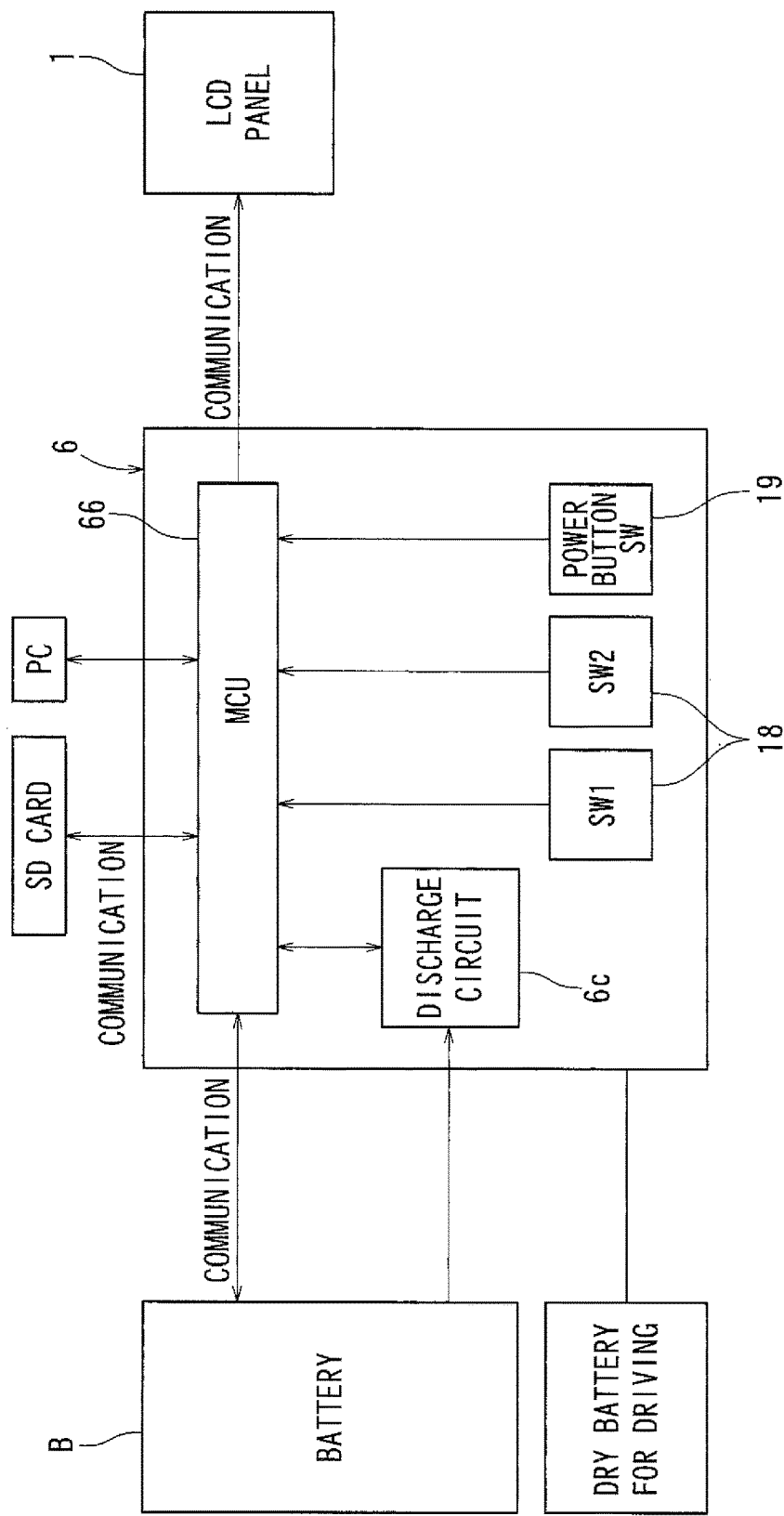
FIG. 36 is a block diagram of the battery checker.

As shown in FIGS. 33 and 36, a connector 6d is attached to the board main body 6a, and a cable of a micro USB or the like is connected to the connector 6d. The circuit board 6 and a computer (PC) are connected by the connector cable, and the controller 6b transmits the diagnosis results, etc. of the battery B as a signal to the computer. The computer receives the diagnosis results of the battery B through said cable, and can perform the display, etc. thereof. Further, the circuit board 6 and a printer may also be connected by said cable. In this manner, diagnosis results, etc. of the battery B may be printed.

As shown in FIGS. 33 and 36, a card reader 6e is attached to the board main body 6a, and a memory card such as an SD card is inserted into the card reader 6e. The card reader 6e allows for the memory card and the controller 6b to be connected so as to allow communication. Thus, based on the information stored in the memory card, the program (firmware) stored in the controller 6b can be updated, replaced, or manipulated, etc. Alternatively, the diagnosis results, etc. of the battery B stored in the controller 6b can be transmitted to the memory card for storage, showing that two-way transmission is possible. The memory card recording the diagnosis results, etc. of the battery B may be connected to the computer, and the computer may read the diagnosis results, etc. of the battery B to display or print out the same.

Figure 34:
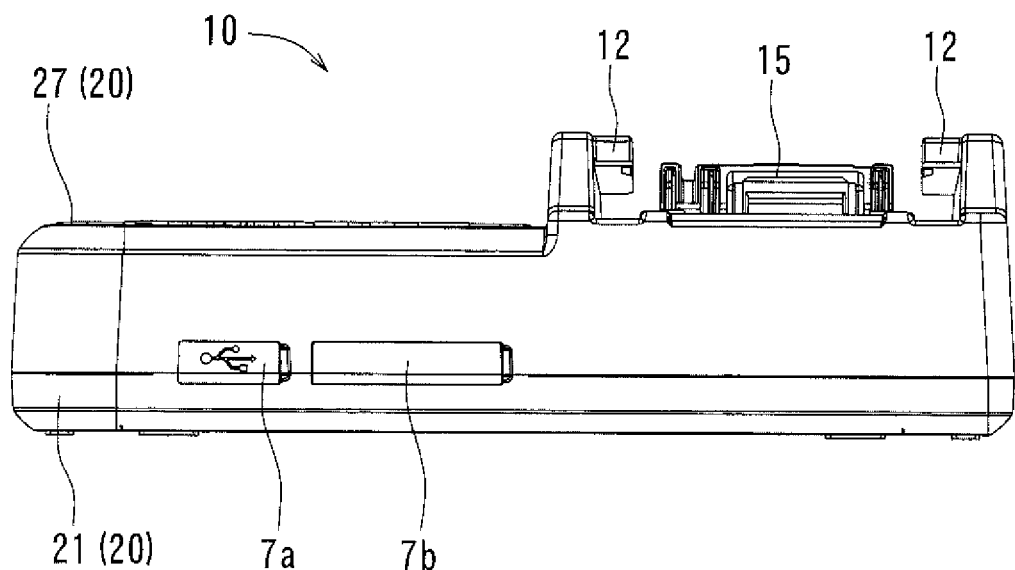
FIG. 34 is an upper side view of a battery checker.
Figure 35:
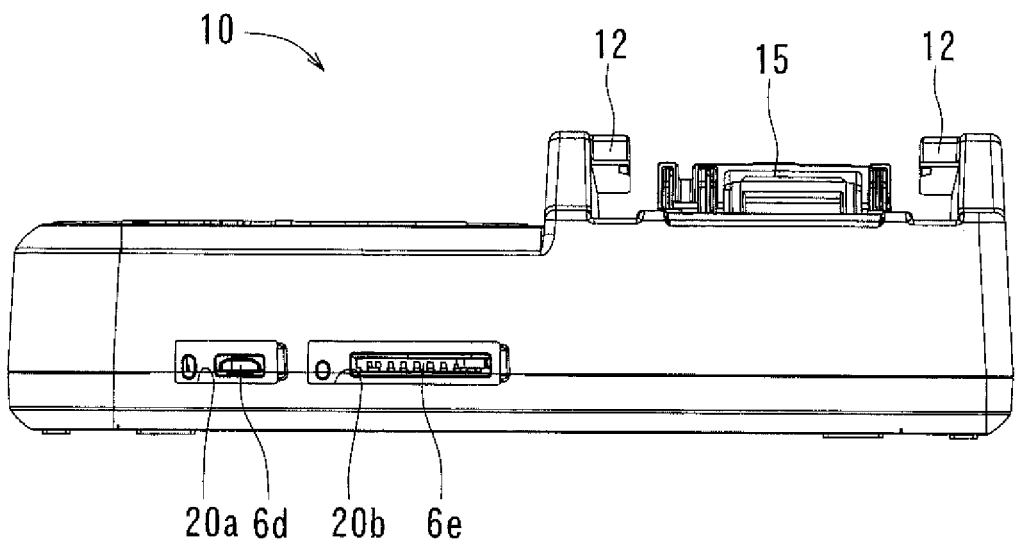
FIG. 35 is an upper side view of the battery checker.

As shown in FIGS. 34 and 35, the case 20 has openings 20a and 20b opening the connector 6d and the card reader 6e, respectively. As shown in FIG. 34, covers 7a and 7b for covering the openings 20a and 20b are detachably mounted to the case 20.

As shown in FIG. 36, the controller 6b is connected to the liquid crystal display panel 1 via a cable 4 shown in FIG. 28 so as to allow communication. The liquid crystal display panel 1 receives the signal transmitted from the controller 6b, and displays the diagnosis results, etc. of the battery B.

As shown in FIGS. 33 and 36, an operating portion (operating button) 18 and a power button 19 are mounted to the board main body 6a. The operating portion 18 has a restore switch SW1, which is a pushbutton, and a transmission switch SW2, which is also a pushbutton. When the pushbutton of SW2 is depressed, the transmission switch SW2 transmits a signal to the controller 6b, and the controller 6b transmits a display signal to the liquid crystal display panel 1 so as to replace the display on the liquid crystal panel 1 by a next display. When the pushbutton of SW1 is depressed, the restore switch SW1 transmits a signal to the controller 6b, and the controller 6b transmits a display signal to the liquid display panel 1 such that the former display is restored. The power button 19 is a pushbutton; by being depressed, it transmits a signal to the controller 6b. Based on the signal from the power button 19, the controller 6b switches between an ON state in which the power from the dry battery for driving is supplied to the liquid crystal display panel 1 and an OFF state in which the power supply is cut off.

Figure 32:
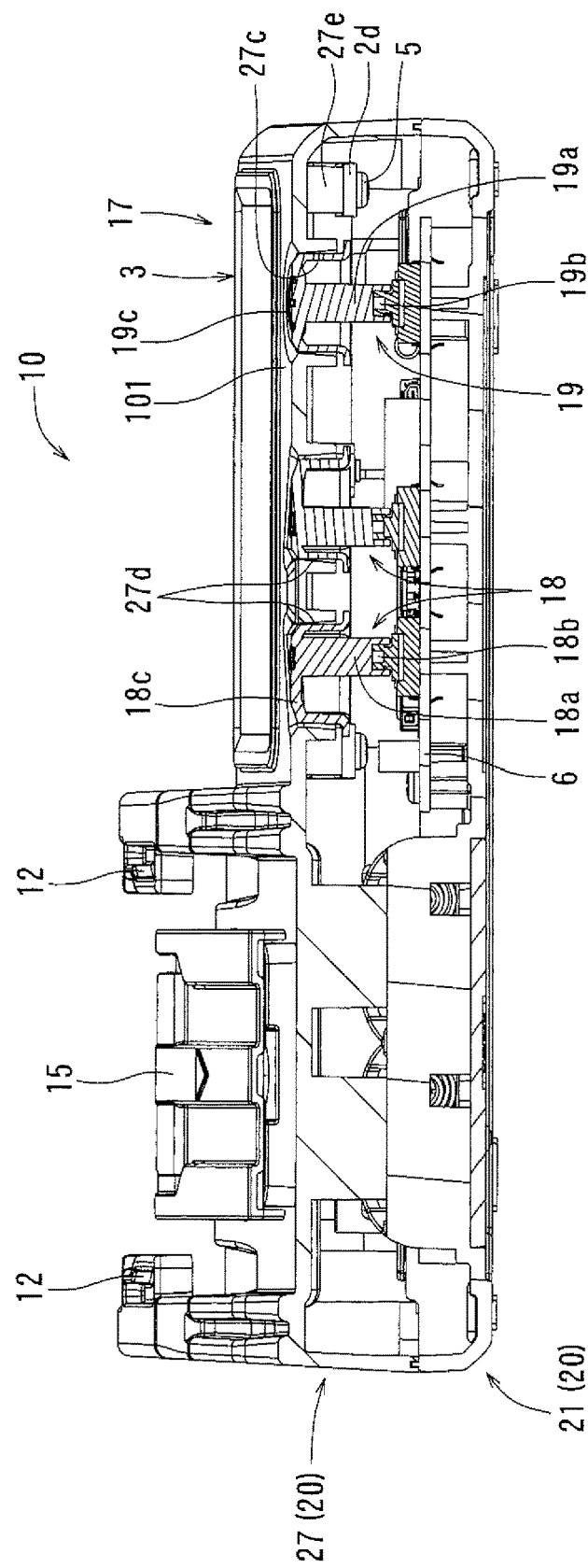
FIG. 32 is a cross-sectional view taken along line XXXII-XXXII in FIG. 1.

As shown in FIGS. 31 and 32, the operating portion and the power button 19 have a leg portion 18a, 19a and a head portion 18c, 19c. At the distal end of the leg portion 18a, 19a, there is provided a switch mechanism 18b, 19b electrically connected to the circuit board 6, and the operations of the operating portion 18 and of the power button 19 are converted to electric signals by the respective switch mechanisms 18b and 19b.

As shown in FIGS. 31 and 32, the head portions 18c and 19c of the operating portion 18 and the power button 19, respectively, are of a configuration in conformity with the front side surface 101 of the front case 27, and are situated somewhat below the front side surface 101. Thus, erroneous operation of the operating portion 18 and the power button 19 where the buttons are not depressed beyond a threshold length is suppressed. The surface of the head portion 18c of the operating portion 18 is farther inclined to the back side as it extends away from the portion near the other operating portion 18. Furthermore, the surface of the head portion 18c of the operating portion 18 is inclined to the back side downwardly when seen from above. The head portion 19c of the power button 19 has a curved surface configuration the central portion of which is situated on the front of the outer peripheral portion thereof.

As shown in FIGS. 29 and 31, the front case 27 has bosses 27f protruding from the back surface thereof, and the bosses 27f abut the back case 21. Screws are inserted into the back case 21 from the back, and the distal ends of the screws a threadedly engage with the bosses 27f. As a result, the front case 27 is mounted to the back case 21.

Instead of the main body plate 2a shown in FIGS. 28 and 29, in an alternative embodiment the LCD case 2 may adopt some other structure such as a net-like structure or an annular structure having solely an outer peripheral portion. The LCD case 2 and the LCD cover 3 are attached to each other by the lock portions 2c formed on the LCD case 2 as described above, and the claws 3e formed on the LCD cover 3. Instead, in an alternative embodiment, the LCD case 2 and the LCD cover 3 may be attached to each other by claws formed on the LCD case 2 and lock portions formed on the LCD cover 3. Alternatively, the LCD case 2 and the LCD cover 3 may be attached to each other by some other mounting structures instead of lock portions and claws, such as bosses and screws.

The above-described liquid crystal display panel 1 displays the diagnosis results of the battery B diagnosed by the battery checker 10. Instead, in an alternative embodiment, the electric tool battery may be attached to an apparatus different from the battery checker, and the liquid crystal display panel 1 may receive the condition of the battery B attached to the above-mentioned separate apparatus, including e.g., the recharging condition thereof, from the controller and display it on the panel 1.

The various examples described above in detail with reference to the attached drawings are intended to be representative of the invention and thus non-limiting embodiments. The detailed description is intended to teach a person of skill in the art to make, use and/or practice various aspects of the present teachings and thus does not limit the scope of the invention in any manner. Furthermore, each of the additional features and teachings disclosed above may be applied and/or used separately or with other features and teachings in any combination thereof, to provide improved battery attachment apparatuses, and/or methods of making and using the same.

What is claimed is:

1. A battery attachment apparatus to which an electric tool battery is detachably attached comprising:
    a case as an exterior portion of the battery attachment apparatus, wherein the case includes a front face on which the electric tool battery is detachably attached;
    a lock hole formed within the case extending to its interior, establishing communication between an exterior and interior of the case, wherein the lock hole is formed at one face that is different from the front face of the case;
    a lock member locked to the lock hole;
    a cover member enclosing or closing an opening of the lock hole from within the case; and
    a mounting portion provided on an inner surface of the case, wherein the cover member is mounted to the mounting portion, wherein
    the mounting portion includes a mounting support portion that faces the lock hole,
    the mounting support portion is configured to support the cover member from within the interior of the case toward the lock hole,
    the mounting portion is configured such that the cover member is mounted to the mounting portion by moving the cover member along the inner surface of the case,
    the mounting portion includes a detachment regulating portion configured to regulate the cover member from detaching with respect to the mounting portion, and
    the mounting support portion is configured to allow mounting of the cover member to the mounting portion beyond the detachment regulating portion through elastic deformation of the mounting support portion.

2. The battery attachment apparatus of claim 1, wherein the cover member is provided with a structure into which the mounting support portion is fitted.

3. The battery attachment apparatus of claim 1, wherein the cover member is provided with a wall that overlaps with an edge of the mounting portion in its mounted position.

4. The battery attachment apparatus of claim 3, wherein the wall of the cover member forms a friction fit with the overlapping edge of the mounting portion when the cover member is mounted to the mounting portion, forming an exterior periphery of the enclosure of the lock hole by the cover member.

5. The battery attachment apparatus of claim 1, wherein the lock member comprises a leg portion supported while embedded in a wall, and a lock head portion of a larger outer diameter than the leg portion,
    the lock hole includes a first hole portion allowing insertion of the lock head portion, and a second hole portion of a shorter inner diameter than the first hole portion so as to regulate detachment of the inserted lock head portion, wherein the first and second hole portions are formed continuously, one above and the other below, connected by an intermediate hole.

6. The battery attachment apparatus of claim 1, wherein the cover member when mounted to the mounting portion fully encloses the lock hole from the interior of the case through a friction fit with the mounting portion, wherein the cover member's hole-enclosing portion has a side which faces the exterior of the case, wherein the mounting portion is positioned on the backside of said cover member's side, within the interior of the case.

7. The battery attachment apparatus of claim 1, wherein the one face formed with the lock hole is a back face of the case that is opposite to the front face.

8. A battery attachment apparatus to which an electric tool battery is detachably attached comprising:
    a case as an exterior portion of the battery attachment apparatus, wherein the case includes a front face on which the electric tool battery is detachably attached;
    a lock hole formed within the case extending to its interior, establishing communication between an exterior and interior of the case, wherein the lock hole is formed at one face that is different from the front face of the case;
    a lock member locked to the lock hole;
    a cover member enclosing or closing an opening of the lock hole from within the case; and
    a mounting portion provided on an inner surface of the case, wherein the cover member is mounted to the mounting portion, wherein the mounting portion is configured such that the cover member is mounted thereto by moving the cover member downwards from above relative to the mounting portion, along the inner surface of the case.

9. The battery attachment apparatus of claim 8, wherein the mounting portion includes a mounting support portion that faces the lock hole, and
    the mounting support portion is configured to support the cover member from within the interior of the case toward the lock hole.

10. The battery attachment apparatus of claim 9, wherein the mounting portion is configured such that the cover member is mounted to the mounting portion by moving the cover member along the inner surface of the case.

11. The battery attachment apparatus of claim 10, wherein the mounting portion includes a detachment regulating portion configured to regulate the cover member from detaching with respect to the mounting portion, and
    the mounting support portion is configured to allow mounting of the cover member to the mounting portion beyond the detachment regulating portion through elastic deformation of the mounting support portion.

12. A battery attachment apparatus to which an electric tool battery is detachably attached comprising:
    a microcontroller;
    an LCD panel;
    a case as an exterior portion of the battery attachment apparatus;
    a lock hole foliated within the case extending to its interior, establishing communication between an exterior and interior of the case;
    a lock member locked to the lock hole;
    a cover member enclosing or closing an opening of the lock hole from within the case; and
    a mounting portion provided on an inner surface of the case, wherein the cover member is mounted to the mounting portion,
    wherein the case comprises a back case affixed via screws to a front case containing bosses which threadably engage said screws, wherein the front case also has a window opening.

13. The battery attachment apparatus of claim 12, wherein the microcontroller and LCD panel are electrically connected and provided on the back case, wherein the microcontroller transmits a signal to the LCD panel of the back case based on stored algorithms collecting diagnosis results from data gathered on the attached electric tool battery.

14. The battery attachment apparatus of claim 12, wherein the LCD panel is stored on a LCD case to which it is bonded, wherein the LCD case is attached to the front case via protrusions formed on the LCD case which interact with the lower interior surface of the window opening of the front case to form a friction fit, wherein an LCD cover is also present and positioned in between the LCD case and said window opening, wherein the LCD cover has claws which fit through holes on the LCD case to attach the LCD cover to the LCD case, wherein the LCD cover has a parabolic upper surface which distributes applied external force to the periphery of its surface and protects the LCD panel, where the effect of said applied external force on the LCD panel is further diminished through absorption by the LCD case.

15. A battery attachment apparatus to which an electric tool battery is detachably attached comprising:

- a case as an exterior portion of the battery attachment apparatus, wherein the case includes a front face on which the electric tool battery is detachably attached;
- a lock hole formed within the case extending to its interior, establishing communication between an exterior and interior of the case, wherein the lock hole is formed at one face that is different from the front face of the case;
- a lock member locked to the lock hole;
- a cover member enclosing or closing an opening of the lock hole from within the case; and
- a mounting portion provided on an inner surface of the case, wherein the cover member is mounted to the mounting portion, wherein the mounting portion includes a mounting support portion that faces the lock hole, the mounting support portion is configured to support the cover member from within the interior of the case toward the lock hole, the mounting portion is configured such that the cover member is mounted to the mounting portion by moving the cover member along the inner surface of the case, and the mounting portion is configured such that the cover member is mounted thereto by moving the cover member right-to-left or left-to right relative to the mounting portion, along the inner surface of the case.

* * * * *